United States Patent
Yang et al.

(10) Patent No.: US 7,852,662 B2
(45) Date of Patent: Dec. 14, 2010

(54) SPIN-TORQUE MRAM: SPIN-RAM, ARRAY

(75) Inventors: Hsu Kai Yang, Pleasanton, CA (US);
Po-Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 696 days.

(21) Appl. No.: 11/789,324

(22) Filed: Apr. 24, 2007

(65) Prior Publication Data
US 2008/0266943 A1 Oct. 30, 2008

(51) Int. Cl.
*G11C 11/00* (2006.01)

(52) U.S. Cl. .................................. 365/158; 365/243.5

(58) Field of Classification Search .............. 365/158, 365/243.5
See application file for complete search history.

(56) References Cited

U.S. PATENT DOCUMENTS

| | | | |
|---|---|---|---|
| 6,097,626 | A | 8/2000 | Brug et al. |
| 6,130,814 | A | 10/2000 | Sun |
| 6,847,547 | B2 | 1/2005 | Albert et al. |
| 6,865,109 | B2 | 3/2005 | Covington |
| 6,980,469 | B2 | 12/2005 | Kent et al. |
| 7,006,375 | B2 | 2/2006 | Covington |
| 7,009,877 | B1 | 3/2006 | Huai et al. |
| 7,102,920 | B2 | 9/2006 | Perner et al. |
| 7,187,577 | B1 * | 3/2007 | Wang et al. .................. 365/158 |
| 7,436,699 | B2 * | 10/2008 | Tanizaki et al. .............. 365/158 |

| | | | |
|---|---|---|---|
| 2005/0117392 | A1 | 6/2005 | Hayakawa et al. |
| 2005/0122768 | A1 | 6/2005 | Fukumoto |
| 2006/0023497 | A1 * | 2/2006 | Kawazoe et al. ............ 365/158 |
| 2006/0171198 | A1 | 8/2006 | Saito et al. |

FOREIGN PATENT DOCUMENTS

EP 1 486 985 A2 12/2004

(Continued)

OTHER PUBLICATIONS

"A Novel Nonvolatile Memory with Spin Torque Transfer Magnetization Switching:Spin-RAM", by M. Hosomi et al., IEEE Int'l Electron Devices Meeting, 2005, IEDM Tech. Digest, Dec. 2005, pp. 459-462.

(Continued)

*Primary Examiner*—Hoai V Ho
*Assistant Examiner*—Anthan T Tran
(74) *Attorney, Agent, or Firm*—Saile Ackerman LLC; Stephen B. Ackerman; Billy Knowles

(57) ABSTRACT

A spin-torque MRAM array has MRAM cells arranged in rows and columns. Bit lines are connected to each of the MRAM cells on each column. Source select lines are connected to each MRAM cell of a pair of rows and are oriented orthogonally to the bit lines. Write lines are connected to the gate of the gating MOS transistor of each MRAM cell of the rows. The MRAM cells are written in a two step process with selected MRAM cells written to a first logic level (0) in a first step and selected MRAM cells written to a second logic level (1) in a second step. A second embodiment of the spin-torque MRAM array has the bit lines commonly connected together to receive the data and the source select lines commonly connected together to receive an inverse of the data for writing.

35 Claims, 14 Drawing Sheets

FOREIGN PATENT DOCUMENTS

EP    08392003.3-2210    7/2008

OTHER PUBLICATIONS

"Spin-Transfer Switching Current Distribution and Reduction in Magnetic Tunneling Junction-Based Structures", by Yiming Huai et al., IEEE Transactions on Magnetics, vol. 41, No. 10, Oct. 2005, pp. 2621-2626.

"Highly scalable MRAM using field assisted current induced switching", by W.C. Jeong et al., 2005 Symposium on VLSI Tech. Digest of Tech. Papers, pp. 184-185.

* cited by examiner

Write a single cell in an array

| Cells data to be written | Step | W1 | W2 | Y1 | Y2 | D | S12 | Comments |
|---|---|---|---|---|---|---|---|---|
| C11 "0" | 1 | H | L | H | L | L | H | Writes "0" in C11 |
|  | 2 | H | L | H | L | L | L | No Change |
| C11 "1" | 1 | H | L | H | L | H | H | No Change |
|  | 2 | H | L | H | L | H | L | Writes "1" in C11 |

FIG. 7a

Write a single cell in an array with valid data line during 2nd step only

| Cells data to be written | Step | W1 | W2 | Y1 | Y2 | D | S12 | Comments |
|---|---|---|---|---|---|---|---|---|
| C11 "0" | 1 | H | L | H | L | L | H | Writes "0" in C11 |
|  | 2 | H | L | H | L | L | L | No Change |
| C11 "1" | 1 | H | L | H | L | L | H | Writes "0" in C11 |
|  | 2 | H | L | H | L | H | L | Changes c11 to "1" |

FIG. 7b

Write 2 or more cells along the word line

| Cells data to be written | Step | W1 | W2 | Y | D1 | D2 | S12 | Comments |
|---|---|---|---|---|---|---|---|---|
| C11 "0" C12 "0" | 1 | H | L | H | L | L | H | Writes "0" in C11 and C12 |
|  | 2 | H | L | H | L | L | L | No Change |
| C11 "0" C12 "1" | 1 | H | L | H | L | H | H | Writes "0" in C11,C12 no change |
|  | 2 | H | L | H | L | H | L | C11 no change, Writes "1" in C12 |
| C11 "1" C12 "0" | 1 | H | L | H | H | L | H | C11 no change, Writes "0" in C12 |
|  | 2 | H | L | H | H | L | L | Writes "1" in C11,C12 no change |
| C11 "1" C12 "1" | 1 | H | L | H | H | H | H | No Change |
|  | 2 | H | L | H | H | H | L | Writes "1" in C11 and C12 |

FIG. 7C

Write 2 or more cells along the word line with valid data on data line during 2nd step only

| Cells data to be written | Step | W1 | W2 | Y | D1 | D2 | S12 | Comments |
|---|---|---|---|---|---|---|---|---|
| C11 "0" C12 "0" | 1 | H | L | H | L | L | H | Writes "0" in C11 and C12 |
|  | 2 | H | L | H | L | L | L | No Change |
| C11 "0" C12 "1" | 1 | H | L | H | L | L | H | Writes "0" in C11 and C12 |
|  | 2 | H | L | H | L | H | L | C11 no change, changes C12 to "1" |
| C11 "1" C12 "0" | 1 | H | L | H | L | L | H | Writes "0" in C11 and C12 |
|  | 2 | H | L | H | H | L | L | Changes C11 to "1", C12 no change |
| C11 "1" C12 "1" | 1 | H | L | H | L | L | H | Writes "0" in C11 and C12 |
|  | 2 | H | L | H | H | H | L | Changes C11 and C12 to "1" |

FIG. 7d

SPIN-TORQUE MRAM: SPIN-RAM, ARRAY

BACKGROUND OF THE INVENTION

1. Field of the Invention

This invention relates generally to memory cells array structures, and methods for writing and reading the memory cells. More particularly, this invention relates to spin-torque magnetic random access memory (MRAM) cells, array structures for spin-torque MRAM cells, and methods for writing and reading spin-torque MRAM cells.

2. Description of Related Art

The term Spin-RAM refers to a magnetic tunnel junction (MTJ) random access memory (RAM). In this context, the term "spin" refers to the angular momentum of electrons passing through an MTJ that will alter the magnetic moment of a free layer of an MTJ device. Electrons possess both electric charge and angular momentum (or spin). It is known in the art that a current of spin-polarized electrons can change the magnetic orientation of a free ferromagnetic layer of an MTJ via an exchange of spin angular momentum.

"A Novel Nonvolatile Memory with Spin-torque Transfer Magnetization Switching: Spin-Ram", Hosomi, et al., IEEE International Electron Devices Meeting, 2005. IEDM Technical Digest. December 2005, pp.: 459-462, provides a nonvolatile memory utilizing spin-torque transfer magnetization switching (STS), abbreviated Spin-RAM. The Spin-RAM is programmed by magnetization reversal through an interaction of a spin momentum-torque-transferred current and a magnetic moment of memory layers in magnetic tunnel junctions (MTJs), and therefore an external magnetic field is unnecessary as that for a conventional MRAM.

Refer now to FIG. 1 for an explanation of spin-torque transfer switching (STS) in an MTJ element 5 as described Hosomi, et al. A spin-torque MTJ 5 element has two ferromagnetic layers, F1 10 and F2 15, and a spacer layer 20 between the ferromagnetic layers, F1 10 and F2 15. The ferromagnetic layers, F1 10 is a pinned magnetic layer. The spacer layer 20 is a tunnel barrier layer. The ferromagnetic layer F2 15 is a free magnetic layer. When a spin polarized electron 40 flows through the ferromagnetic layers, F1 10 and F2 15, the spin direction 42 rotates according to the directions of magnetic moment M2 55 and M1 50 respectively to the directions 43 and 44. The rotation of spin direction of the electrons in the ferromagnetic layers, F1 10 and F2 15 are the origin of a spin-torque, dM1/dt 47 and dM2/dt 45, to the magnetic moment M1 50 and M2 55. The given torque is large enough, magnetization of ferromagnetic layer F2 15 and thus the magnetic moment M2 55 is reversed. The magnetization of the ferromagnetic layers, F1 10 and F2 15 transforms from parallel to anti-parallel alignment. This changes the MTJ element 5 from a low resistance state to a high resistance state thus changing the logic state of the MTJ element from a first logic state (0) to a second logic state (1).

The voltage source 35 provides the programming voltage $V_{PROG}$ that generates the programming current $i_{PROG}$ that is reversed appropriately change the programming state of the MTJ element 5.

As illustrated in FIG. 2, an MRAM cell 100 consists of an MTJ element 105 and a Metal Oxide Semiconductor (MOS) transistor 110. The MTJ element 105 is composed of a pinned ferromagnetic layer 102 and a free ferromagnetic layer 104, and a tunnel barrier layer 103 as described in FIG. 1. The drain of the MOS transistor 110 is connected through a nonmagnetic layer to the pinned ferromagnetic layer 102. The free ferromagnetic layer 104 is connected to a bit line 115 and the source of the MOS transistor 110 is connected the source select line 120. The bit line 115 and source select line 120 are connected to the bipolar write pulse/read bias generator 125. The bipolar write pulse/read bias generator 125 provides the necessary programming current to the MTJ element 105 through the bit line 115 and the source select line 120. The direction being determined by logic state being programmed to the MTJ element 105.

The gate of the MOS transistor 110 is connected to a word line 130. The word line 130 is transfers a word line select voltage to the gate of the MOS transistor 110 to activate the MOS transistor 110 for reading or writing the logic state of the MTJ element 105. A sense amplifier 135 has one input terminal connected to the bit line and a second input terminal connected to a voltage reference circuit. When the word line 115 has the word line select voltage activated to turn on the MOS transistor 110, the bipolar write pulse/read bias generator 125 generates a bias current that passes through MTJ element 105. A voltage is developed across the MTJ element 105 that is sensed by the sense amplifier 135 and compared with the reference voltage generator to determine the logic state written to the MTJ element 105. This logic state is transferred to the output terminal of the sense amplifier 135 as to the data output signal 145.

Refer to FIG. 3 for a description of an array of MRAM cells 100. The MRAM cells 100 are arranged in rows and columns. The gate of the MOS transistor of each of the MRAM cell 100 on a row of the MRAM cells 100 is connected to a word line $200a, 200b, \ldots, 200n\text{-}1, 200n$ to receive the word line select signal to activate the MOS transistor for writing and reading of a selected MRAM cell 100. One terminal of each of MTJ element of the MRAM cells 100 on a column of MRAM cells 100 is connected to a bit line $205a, 205b, \ldots, 205m$. The source of each MOS transistor of each of the MRAM cells 100 is connected to a source select line $210a, 210b, \ldots, 210m$. During a write operation, a programming voltage is transferred either from a selected bit line $205a, 205b, \ldots, 205m$ through the selected MRAM cell 100 to the selected source select line $210a, 210b, \ldots, 210m$ or from selected source select line $210a, 210b, \ldots, 210m$ through the selected MRAM cell 100 to the a selected bit line $205a, 205b, \ldots, 205m$, dependent upon the logic state to be written to the selected MRAM cell 100.

The array structure of Hosomi, et al. as shown requires essentially two bit lines—the bit lines $205a, 205b, \ldots, 205m$ and the source select lines $210a, 210b, 210m$. This structure as described leads to an inefficient cell and MRAM cell 100 and array layout.

"Highly Scalable MRAM Using Field Assisted Current Induced Switching", Jeong, et al, 2005 Symposium on VLSI Technology, 2005. Digest of Technical Papers, June 2005, pp. 184-185, describes an MRAM structure using current induced switching.

"Spin-Transfer Switching Current Distribution and Reduction in Magnetic Tunneling Junction-Based Structures", Huai, et al., IEEE Transactions on Magnetics, October 2005, Vol.: 41, Issue: 10, pp.: 2621-2626, provides the results of studies into a spin transfer switching current distribution within a cell and switching current reduction at room temperature for magnetic tunnel junction-based structures with resistance area product (RA) ranged from 10 to $30\Omega^2$ and TMR of 15%-30%.

U.S. Pat. No. 6,097,626 (Brug, et al.) teaches an MRAM device using magnetic field bias to suppress inadvertent switching of half-selected memory cells. The magnetic field bias is applied to half-selected memory cells during a write operation.

U.S. Pat. No. 6,130,814 (Sun) describes a magnetic switching device, includes two electrodes and a nanoparticle between the two electrodes having a magnetic moment. At least one of the electrodes includes a magnetic material which has a net spin polarization in its conduction band for injecting, into the nanoparticle, an electrical current including a net spin polarization for overcoming the magnetic moment of the nanoparticle upon selection of a predetermined magnitude for the electrical current.

U.S. Pat. No. 6,847,547 (Albert, et al.) provides magnetostatically coupled magnetic elements utilizing spin transfer. The magnetic element is configured to write to the free layers using spin transfer when a write current is passed through the magnetic element.

U.S. Pat. No. 6,865,109 (Covington) describes a magnetic random access memory having flux closure for the free layer and spin transfer write mechanism.

U.S. Pat. No. 6,980,469 (Kent, et al.) illustrates a high speed low power magnetic devices based on current induced spin-momentum transfer. The magnetic device comprises a pinned magnetic layer with a fixed magnetization direction, a free magnetic layer with a free magnetization direction, and a read-out magnetic layer with a fixed magnetization direction. The pinned magnetic layer and the free magnetic layer are separated by a non-magnetic layer, and the free magnetic layer and the read-out magnetic layer are separated by another non-magnetic layer. The magnetization directions of the pinned and free layers generally do not point along the same axis. The non-magnetic layers minimize the magnetic interaction between the magnetic layers. A current is applied to the device to induce a torque that alters the magnetic state of the device so that it can act as a magnetic memory for writing information.

U.S. Pat. No. 7,006,375 (Covington) provides a method of writing to a magnetic random access memory by producing a magnetic field along a magnetically hard axis of a free layer of a magnetoresistive element; and passing current through the magnetoresistive element to change a direction of magnetization of the free layer by spin momentum transfer.

U.S. Pat. No. 7,009,877 (Huai, et al.) illustrates a three-terminal magnetostatically coupled spin transfer-based MRAM cell. The MRAM cell has a spin transfer driven element, disposed between a first and a second of the three terminals. A readout element is disposed between the second terminal and a third of the three terminals. The spin transfer driven element and the readout element each include a free layer. A magnetization direction of the free layer in the readout element indicates a data state. A magnetization reversal of the free layer within the spin transfer driven element magnetostatically causes a magnetization reversal of the free layer in the readout element, thereby recording the data state.

U.S. Pat. No. 7,102,920 (Perner, et al.) details a soft-reference three conductor magnetic memory storage device. The device has parallel electrically conductive first sense/write conductors and parallel electrically conductive sense conductors. The sense/write and second sense conductors provide a cross point array where soft-reference magnetic memory cells are provided in electrical contact with and located at each intersection. Parallel electrically conductive write column conductors substantially are proximate to and electrically isolated from the sense conductors. Sense magnetic fields orient the soft-reference layer but do not alter the data stored within the cell.

U.S. Patent Application 20060171198 (Saito, et al.) describes a spin-injection magnetic random access memory. The spin-injection magnetic random access memory includes a magnetoresistive element having a magnetic fixed layer whose magnetization direction is fixed, a magnetic recording layer whose magnetization direction can be changed by injecting spin-polarized electrons, and a tunnel barrier layer provided between the magnetic fixed layer and the magnetic recording layer. A bit line passes spin-injection current through the magnetoresistive element for generation of the spin-polarized electrons. A writing word line has an assist current passed through it for the generation of an assist magnetic field in a magnetization easy-axis direction of the magnetoresistive element. A driver/sinker determines a direction of the spin-injection current and a direction of the assist current.

SUMMARY OF THE INVENTION

An object of this invention is to provide a spin-torque MRAM memory array having a source select line orthogonal to a bit line.

Another object of this invention is to provide a spin-torque MRAM memory array having a two step programming process where a first logic level is written to selected spin-torque MRAM cells during a first step and a second logic level is written to selected spin-torque MRAM cells during a second step.

Further, another object of this invention is provide a spin-torque MRAM memory array where source select lines are connected commonly and an inverse of data written to a selected MRAM cell is applied to the commonly connected source select line.

To accomplish at least one of these objects, a spin-torque magnetic random access memory device includes a plurality of spin-torque MRAM cell arrays arranged in a plurality of groups. Each spin-torque MRAM array includes a plurality of spin-torque MRAM cells arranged in rows and columns. Each spin-torque MRAM cell is formed of a magnetic tunnel junction element, and a select switching device having a drain terminal connected to a first terminal of the magnetic tunnel junction element;

Each spin-torque MRAM array has a plurality of bit lines such that each bit line is associated with one column of the columns of the plurality of spin-torque MRAM cells. Each of the bit lines is connected to a second terminal of the magnetic tunnel junction element of the associated column of spin-torque MRAM cells.

A plurality of word lines is included in each spin-torque MRAM array such that each word line is associated with one row of the plurality of spin-torque MRAM cells. Each word line is connected to a gate terminal of the select switching device of each spin-torque MRAM cell on each associated row to control activation and deactivation of the select switching device.

Each spin-torque MRAM array has a plurality of source select lines configured such that each of the source select lines are orthogonal to each of the plurality of bit lines. Further, each source select line is associated with a pair of rows of the plurality of spin-torque MRAM cells and connected to a source terminal of the select switching device of each of the spin-torque MRAM cells of each pair of rows of the plurality of spin-torque MRAM cells.

Each column of the plurality of spin-torque MRAM cells is associated with a column write select device. Each column write select device has a source terminal connected to each of the plurality of bit lines. A drain terminal is connected to receive a data input signal and gate terminal connected to receive a column write select signal.

The spin-torque MRAM array has bit line decode circuit to receive an address, input data, and a read/write select signal, decode the address, data input signal, and read/write select signal, and in communication with the plurality of bit lines, the drain terminals and gate terminals of each of the plurality of write select devices to select which of the bit lines are activated for reading one of the spin-torque MRAM cells on each selected column and activate those of the column write select devices of a selected column to transfer the input data signal derived from the input data to one selected spin-torque MRAM cell on the selected column;

The spin-torque magnetic random access memory device has a word line decode circuit that receives an address and is in communication with each of the plurality of word lines. The word line decode circuit decodes the address to activate one of the word lines on one row of the array of spin-torque MRAM cells.

The spin-torque magnetic random access memory device has a select line decode circuit that receives the address and the read/write select signal to decode the address. The select line decode circuit is in communication with each of the plurality of source select lines to select one of the source select lines from decoding the address to provide a first logic level and a second logic level for reading and writing the selected spin-torque MRAM cells.

The spin-torque magnetic random access memory device further includes a sense amplifier. The sense amplifier is connected to each of the plurality of bit lines to receive a data read signal from selected spin-torque MRAM cells, amplify and condition the data read signal to generate output data read from the selected spin-torque MRAM cells.

The data input signal applied to the spin-torque magnetic random access memory device may be separate bits to be transferred individually to each of the drains of the plurality of column write select devices. Alternately, the data input signal is a single bit applied to a common connection of all the drain terminals of the plurality of column write select devices. Where the drain terminals of the plurality of column write select devices are commonly connected, all of the plurality of source select lines are commonly connected to receive an inverse of the data input signal.

In a first writing method, a selected spin-torque MRAM cell within a spin-torque MRAM array is written to a first logic level (0) during a first writing step by the word line decode circuit activating the word line associated with the selected spin-torque MRAM cell. The bit line decode circuit then activates the column write select signal connected to the column write select device connected to the column associated with the selected spin-torque MRAM cell. The bit line decode circuit applies a data input signal at the first logic level to the drain of the column write select device connected to the one column associated with the selected spin-torque MRAM cell. The select line decode circuit the applies a second logic level to the source select line of the pair of rows associated with the selected spin-torque MRAM cell.

If the first logic level is to be written to the selected spin-torque MRAM cell, a second writing step does not change the selected spin-torque MRAM cell. The second writing step only writes the second logic level to selected spin-torque MRAM cells. The selected spin-torque MRAM cell is written to the second logic level during the second writing step by the word line decode circuit activating the word line associated with the selected spin-torque MRAM cell. The bit line decode circuit then activates the column write select signal connected to the column write select device connected to the column associated with the selected spin-torque MRAM cell. The bit line decode circuit applies the data input signal at the second logic level to the drain of the column write select device connected to the one column associated with the selected spin-torque MRAM cell. The select line decode circuit then applies the first logic level to the source select line of the pair of rows associated with the selected spin-torque MRAM cell.

In a second writing method, a selected spin-torque MRAM cell is written to a first logic level (0) during a first writing step by the word line decode circuit activating the word line associated with the selected spin-torque MRAM cell. The bit line decode circuit activates the column write select signal that is connected to the column write select device connected to the column associated with the selected spin-torque MRAM cell. The bit line decode circuit applies a data input signal as the first logic level to the drain of the column write select device that is connected to the one column associated with the selected spin-torque MRAM cell. The select line decode circuit applies a second logic level to the source select line of the pair of rows associated with the selected spin-torque MRAM cell to write the first logic level to selected spin-torque MRAM cell. During the writing of the first logic level to the selected spin-torque MRAM cell, a second writing step does not change the selected spin-torque MRAM cell.

When the second logic level is to be written to the selected spin-torque MRAM cell, a first writing step writes a first logic level to the selected spin-torque MRAM cell by the word line decode circuit activating the word line associated with the selected spin-torque MRAM cell. The bit line decode circuit activates the column write select signal connected to the column write select device that is connected to the column associated with the selected spin-torque MRAM cell. The bit line decode circuit applies a data input signal set to the first logic level to the drain of the column write select device that is connected to the one column associated with the selected spin-torque MRAM cell. The select line decode circuit then applies a second logic level to the source select line of the pair of rows associated with the selected spin-torque MRAM cell to write the first logic level to selected spin-torque MRAM cell, even though the selected spin-torque MRAM cell may be being written to the second logic level.

A selected spin-torque MRAM cell is written to the second logic level during the second writing step by the word line decode circuit activating the word line associated with the selected spin-torque MRAM cell. The bit line decode circuit activates the column write select signal connected to the column write select device that is connected to the column associated with the selected spin-torque MRAM cell. The bit line decode circuit applies data input signal that is the second logic level to the drain of the column write select device that is connected to the one column associated with the selected spin-torque MRAM cell. The select line decode circuit then applies the first logic level to the source select line of the pair of rows associated with the selected spin-torque MRAM cell and the selected spin-torque MRAM cell is written to the second logic level.

In a third method of writing a spin-torque MRAM, a plurality of selected spin-torque MRAM cells have data written to them during a first writing step by the word line decode circuit activating the word line associated with the plurality of selected spin-torque MRAM cells. The bit line decode circuit activates the column write select signals connected to the column write select devices that is connected to the columns associated with the plurality of selected spin-torque MRAM cell. The bit line decode circuit applies data input signals of a first logic level and a second logic level representative of input data to be written the plurality of selected spin-torque MRAM cells to the drains of the column write select devices connected to the columns associated with each of the plurality of selected spin-torque MRAM cell. The select line decode circuit the applies a second logic level to the source select line of the pair of rows associated with the plurality selected spin-torque MRAM cell to write the first logic level to those selected spin-torque MRAM cell that are to have the first logic level written to them and to leave unchanged those of the plurality of selected spin-torque MRAM cells that are to have the second logic level written to them.

During the writing the input data to the plurality of selected spin-torque MRAM cell, a second writing step is accomplished by the select line decode circuit applying the first logic to the source select line of the pair of rows associated with the plurality of selected spin-torque MRAM cells such that the second logic level is written to those of the plurality of selected spin-torque MRAM cells that are to have the second logic level written to them and leave unchanged those of the plurality of selected spin-torque MRAM cells that have had the first logic level written to them.

In a fourth method of writing a spin-torque MRAM cell array, a plurality of selected spin-torque MRAM cells have data written by the performing a first writing step and second writing step. The first writing step starts by the word line decode circuit activating the word line associated with the plurality of selected spin-torque MRAM cells. The bit line decode circuit activates the column write select signals connected to the column write select devices that are connected to the columns associated with the plurality of selected spin-torque MRAM cells. The bit line decode circuit applies a first logic level representative of input data to be written the plurality of selected spin-torque MRAM cells to the drains of the column write select devices that are connected to the columns associated with each of the plurality of selected spin-torque MRAM cells. The select line decode circuit then applies a second logic level to the source select line of the pair of rows associated with the plurality selected spin-torque MRAM cell to write the first logic level to all selected spin-torque MRAM cells.

The second writing step is accomplished by the bit line decode circuit applying data input signals of the first logic and the second logic level representative of input data to be written the plurality of selected spin-torque MRAM cells to the drains of the column write select devices that are connected to the columns associated with each of the plurality of selected spin-torque MRAM cells. The select line decode circuit applies the first logic to the source select line of the pair of rows associated with the plurality of selected spin-torque MRAM cells such that the second logic level is written to those of the plurality of selected spin-torque MRAM cells that are to have the second logic level written to them and leave unchanged those of the plurality of selected spin-torque MRAM cells that have had the first logic level written to them.

In a fifth method of writing a spin-torque MRAM cell array a selected spin-torque MRAM cell has data written to it by the word line decode circuit activating the word line associated with the selected spin-torque MRAM cell. The bit line decode circuit activates the column write select signal connected to the column write select device that is connected to the column associated with the selected spin-torque MRAM cell. The bit line decode circuit applies data input signals representative of input data to be written to the selected spin-torque MRAM cell to the drain of the column write select device that is connected to the column associated with the selected spin-torque MRAM cell. The select line decode circuit then applies an inverse of the data input signals to the source select line of the pair of rows associated with the plurality selected spin-torque MRAM cell to write the input data to the selected spin-torque MRAM cell.

BRIEF DESCRIPTION OF THE DRAWINGS

FIG. 7a-7d are tables of logic levels for variations in writing the first embodiment of a spin-torque magnetic tunnel junction memory cell array of this invention shown in FIG. 4.

DETAILED DESCRIPTION OF THE INVENTION

Figure 1:
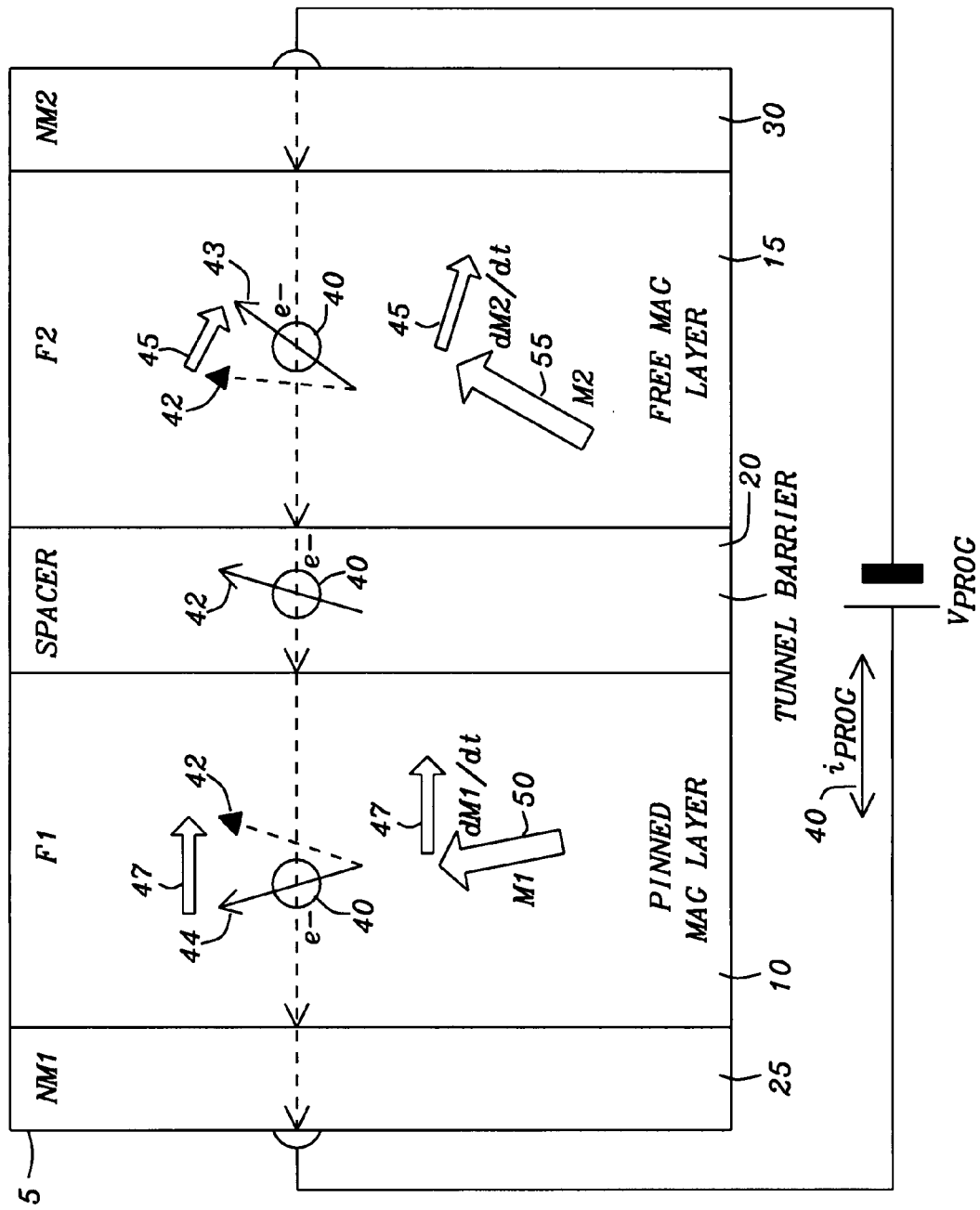
FIG. 1 is a diagram of a spin-torque magnetic tunnel junction of the prior art.
Figure 2:
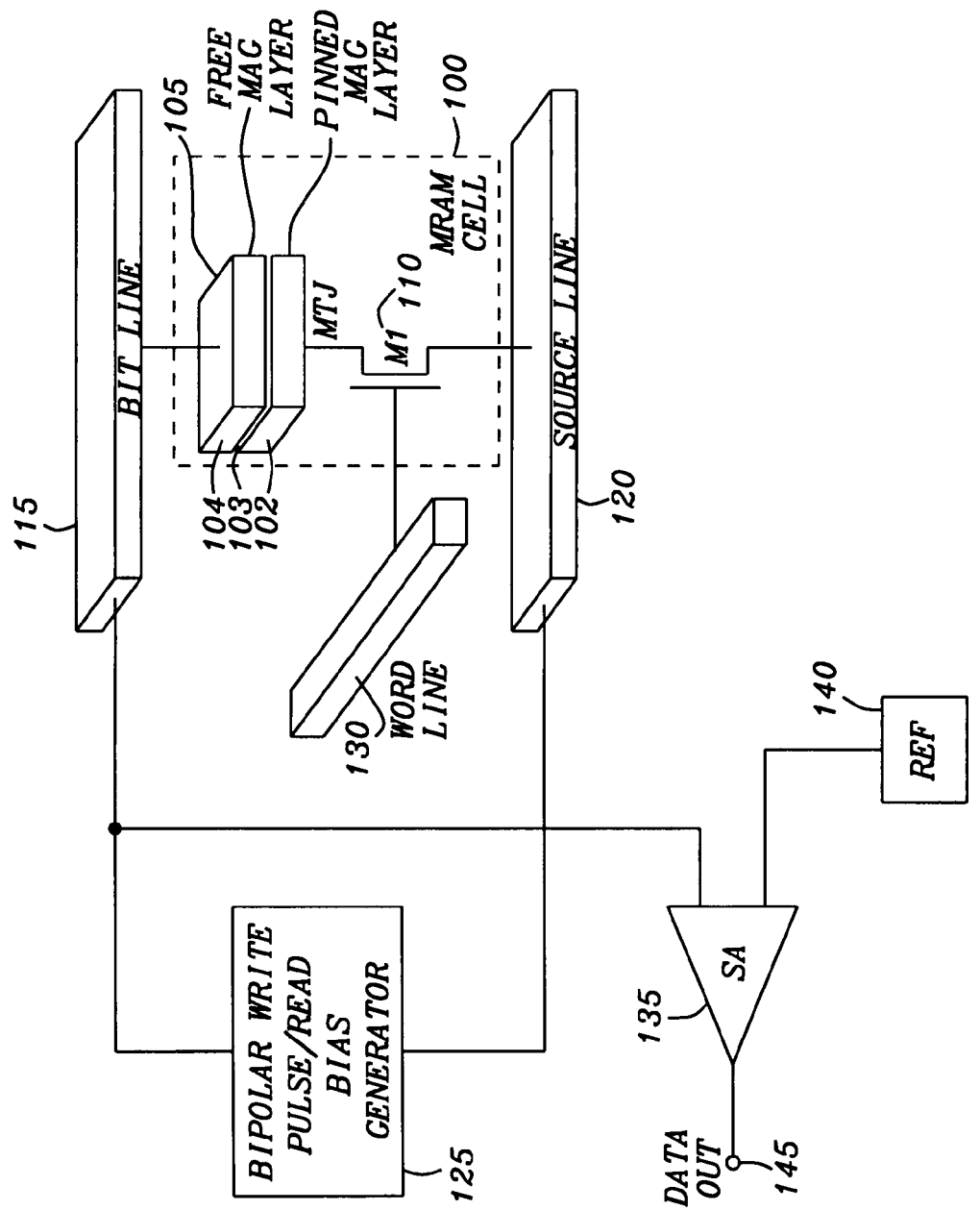
FIG. 2 is a block diagram of a spin-torque magnetic tunnel junction memory cell and its peripheral circuitry of the prior art.
Figure 3:
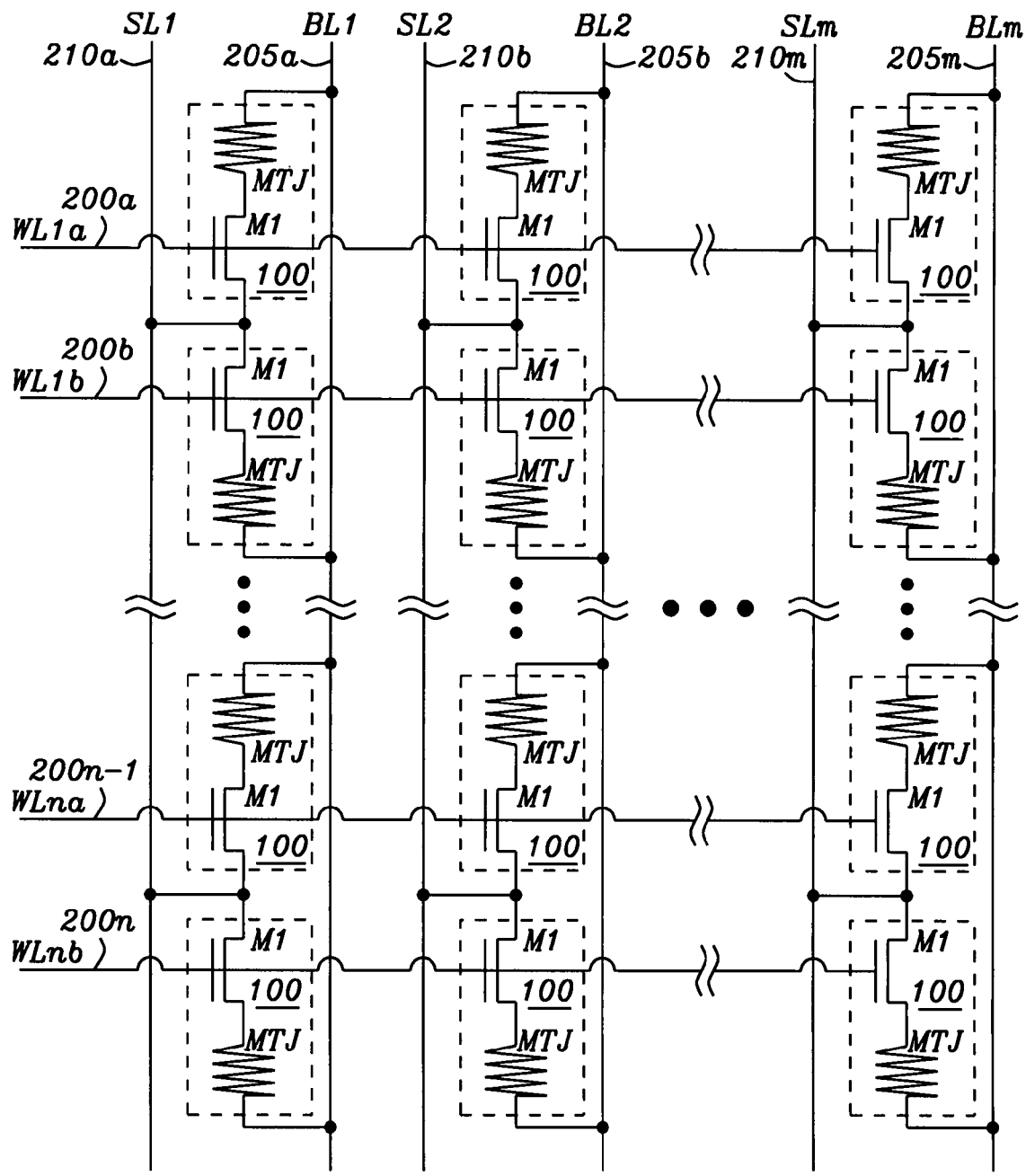
FIG. 3 is schematic diagram of a spin-torque magnetic tunnel junction memory cell array of the prior art.

The spin-torque MRAM array of this invention has a plurality of MRAM cells arranged in rows and columns. Bit lines are connected to each of the MRAM cells for each column of the MRAM cells. Source select lines are connected to each MRAM cell of a pair of rows of MRAM cells are oriented orthogonally to the bit lines. Write lines are connected to the gate of the gating MOS transistor of each MRAM cell of the rows of the MRAM cells.

In a first step of a first method for writing a selected MRAM cell of an array of MRAM cells, the selected MRAM cell is written to first logic level (0) if the data signal to be written is to be the first logic level. If the selected MRAM cell is to be the second logic level (1), it remains unchanged. For a second step of the first method, the selected MRAM cell remains unchanged, if the data signal to be written is to the first logic level. However, if the data signal to be written is the second logic level, the second logic level is written to the selected MRAM cell.

In a first step of a second method for writing a selected MRAM cell of an array of MRAM cells, the selected MRAM cell is written to the first logic level regardless of the logic level of the data signal to be written. For a second step of the second method, the selected MRAM cell remains unchanged, if the data signal to be written is to the first logic level.

However, if the data signal to be written is the second logic level, the second logic level is written to the selected MRAM cell.

In a first step of a third method for writing multiple selected MRAM cells of a row of an array of MRAM cells, the selected MRAM cells is written to first logic level for those of the selected MRAM cells where the data signal to be written is to be the first logic level and for those selected MRAM cells that are to be the second logic level, the logic level remains unchanged. For a second step of the third method, the selected MRAM cells remains unchanged, for those MRAM cells where the data signal to be written is to the first logic level. However, for those MRAM cells where the data signal to be written is the second logic level, the second logic level is written to the selected MRAM cells.

In a first step of a fourth method for writing multiple selected MRAM cells of a row of an array of MRAM cells, all the selected MRAM cells are written to first logic level. For a second step of the fourth method, the selected MRAM cells remains unchanged, for those MRAM cells where the data signal to be written is to the first logic level. However, for those MRAM cells where the data signal to be written is the second logic level, the second logic level is written to the selected MRAM cells.

In a second embodiment of the spin-torque MRAM array of this invention, the bit lines that are connected to each of the MRAM cells for each column of the MRAM cells are commonly connected to receive one data signal bit. Similarly, the source select lines that are connected to each MRAM cell of a pair of rows of MRAM cells are commonly connected. As with the first embodiment, the write lines are connected to the gate of the gating MOS transistor of each MRAM cell of the rows of the MRAM cells. The commonly connected bit lines are connected to receive a single bit data signal and the commonly connected source select lines are connected to an inverse of the single bit data signal. The fifth method for writing a selected MRAM cell of the second embodiment of the array of MRAM cells, the selected MRAM cell is written to the logic level of the data signal to be written by setting the commonly connected bit lines to the logic level of the data signal and the commonly connected source select lines to the inverse logic level of the data signal.

Figure 4:
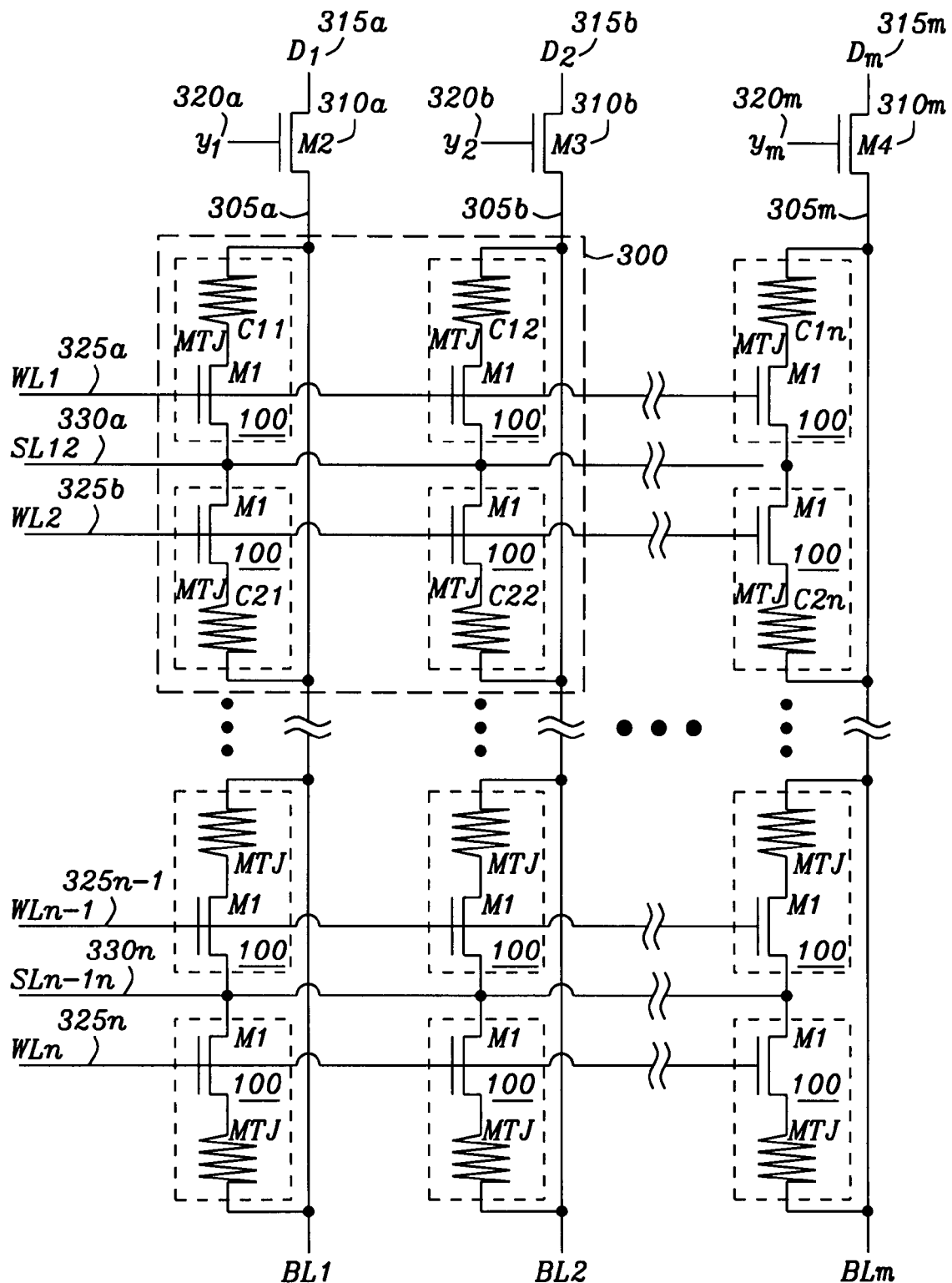
FIG. 4 is schematic diagram of a first embodiment of a spin-torque magnetic tunnel junction memory cell array of this invention.

Refer to FIG. 4 for a description of an array of MRAM cells 100 of this invention. The MRAM cells 100 are arranged in rows and columns. The gate of the MOS transistor of each of the MRAM cell 100 on a row of the MRAM cells 100 is connected to a word line 325a, 325b, ..., 325n-1, 325n to receive the word line select signal to activate the MOS transistor for writing and reading of a selected MRAM cell 100. One terminal of each MTJ element of the MRAM cells 100 on a column of MRAM cells 100 is connected to a bit line 305a, ..., 305n. The source of each MOS transistor of each of the MRAM cells 100 present on a row is connected to a source select line 330a, ..., 330n. It should be noted that there are twice the number of word lines 325a, 325b ..., 325n-1, 325n and bit lines 305a, ..., 305n as there are source select lines 330a, ..., 330n. During a write, a programming current is transferred either from a selected bit line 305a, 305b, ..., 305m through the selected MRAM cell 100 to the selected source select line 330a, ..., 330n or from selected source select line 330a, ..., 330n through the selected MRAM cell 100 to the a selected bit line 305a, 305b, ..., 305m, dependent upon the logic state to be written to the selected MRAM cell 100.

One end of each of the bit lines 305a, 305b, ..., 305m is connected to the source of a gating MOS transistor 310a, 310b, ..., 310m. The drain of each of the gating MOS transistors 310a, 310b, ..., 310m is connected to receive one bit of a data input signal 315a, 315b, ..., 315m and the gate of each of the gating MOS transistors 310a, 310b, ..., 310m is connected to receive a column write select signal $y_1$ 320a, $y_2$ 320b, ..., $y_m$ 320m. A sense amplifier (not shown) is also connected to each of the bit lines 305a, 305b, ..., 305m for sensing the logic state (low resistance vs high resistance) of each of each of the MTJ devices of the MRAM cell 100 to read data from the selected MRAM cell(s) 100.

During a read operation the data input signal 315a, 315b, ..., 315m is replaced by a biasing current that passes through a selected gating MOS transistors 310a, 310b, ..., 310m to a selected gating MOS transistor 310a, 310b, ..., 310m to a selected MRAM cell 100. A selected word line word line 325a, 325b, ..., 325n-1, 325n is activated and a selected source select line 330a, ..., 330n is set to a ground reference voltage. The biasing current passes through the selected MRAM cell 100 to the selected source select line 330a, ..., 330n and the voltage developed across the selected MRAM cell 100 is sensed by the sense amplifier connected to the selected bit line 305a, 305b, ..., 305m. The methods for writing of a selected MRAM cell 100 will be explained hereinafter.

Figure 5:
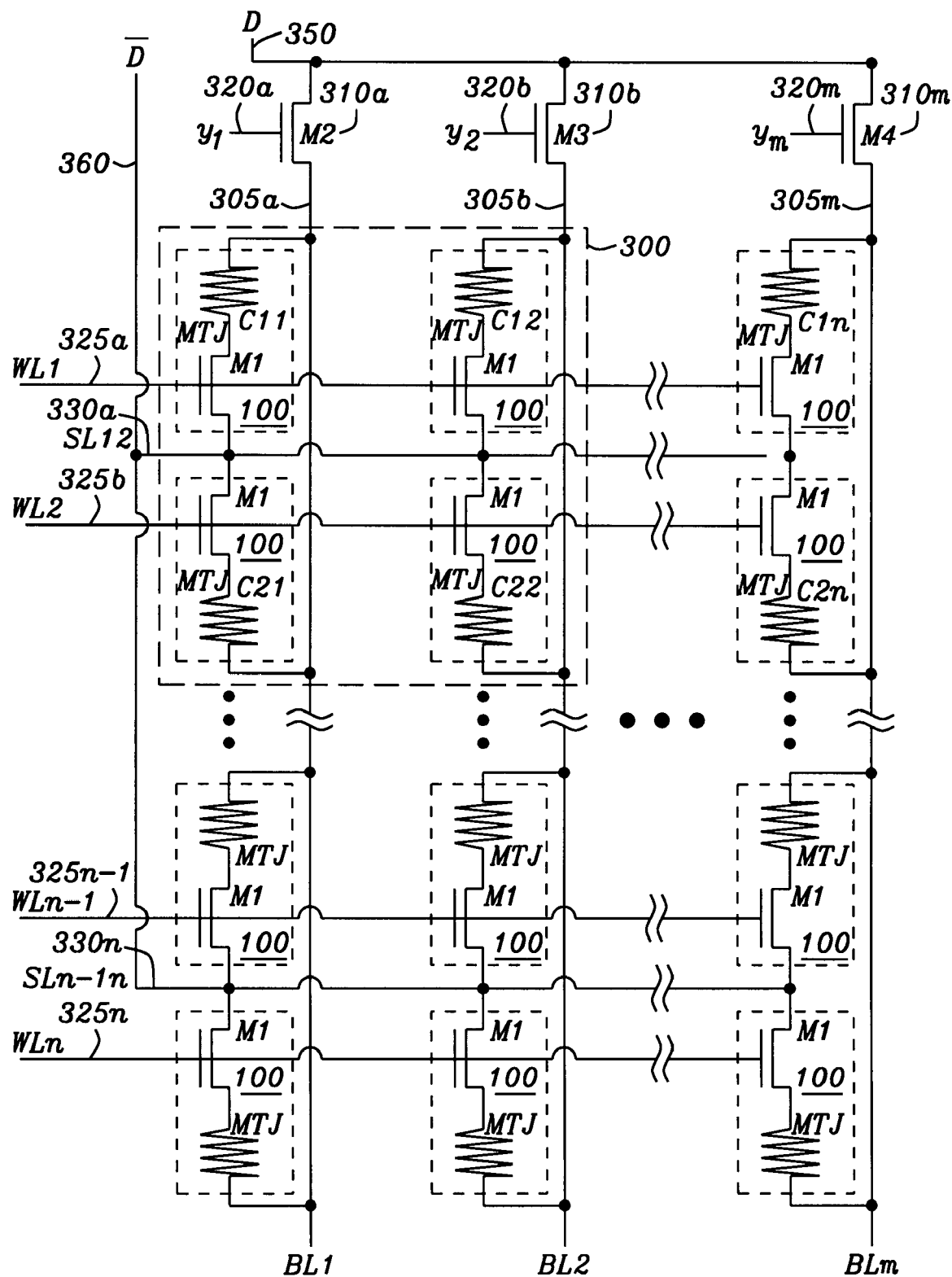
FIG. 5 is schematic diagram of a second embodiment of a spin-torque magnetic tunnel junction memory cell array of this invention.

In FIG. 4 the bit lines 305a, 305b, ..., 305m are separately connected to individual bits of the data input signal 315a, 315b, ..., 315m and the source select lines 330a, ..., 330n are connected pair wise to rows of the MRAM cells 100. A second embodiment of an array of MRAM cells 100 of this invention is shown in FIG. 5. The MRAM cell 100 are arranged in rows and columns as in FIG. 4 with one terminal of each MRAM cell 100 connected to one of the bit lines 305a, 305b, ..., 305m and a second terminal at the source of the gating MOS transistor of each of the MRAM cells 100 is connected to one of the source select lines 330a, ..., 330n as described in FIG. 4. Similarly, the gate of each of the gating MOS transistors of each the MRAM cells 100 is connected to the word line 325a, 325b, ..., 325n-1, 325n associated with the row containing each of the MRAM cells 100. In this second embodiment, all of the drains of each of the gating MOS transistors 310a, 310b, ..., 310m are commonly connected to receive a signal bit data input signal 350. All of the source select lines 330a, ..., 330n are similarly commonly connected to receive an inverse 360 of the signal bit data input signal 350.

Figure 6:
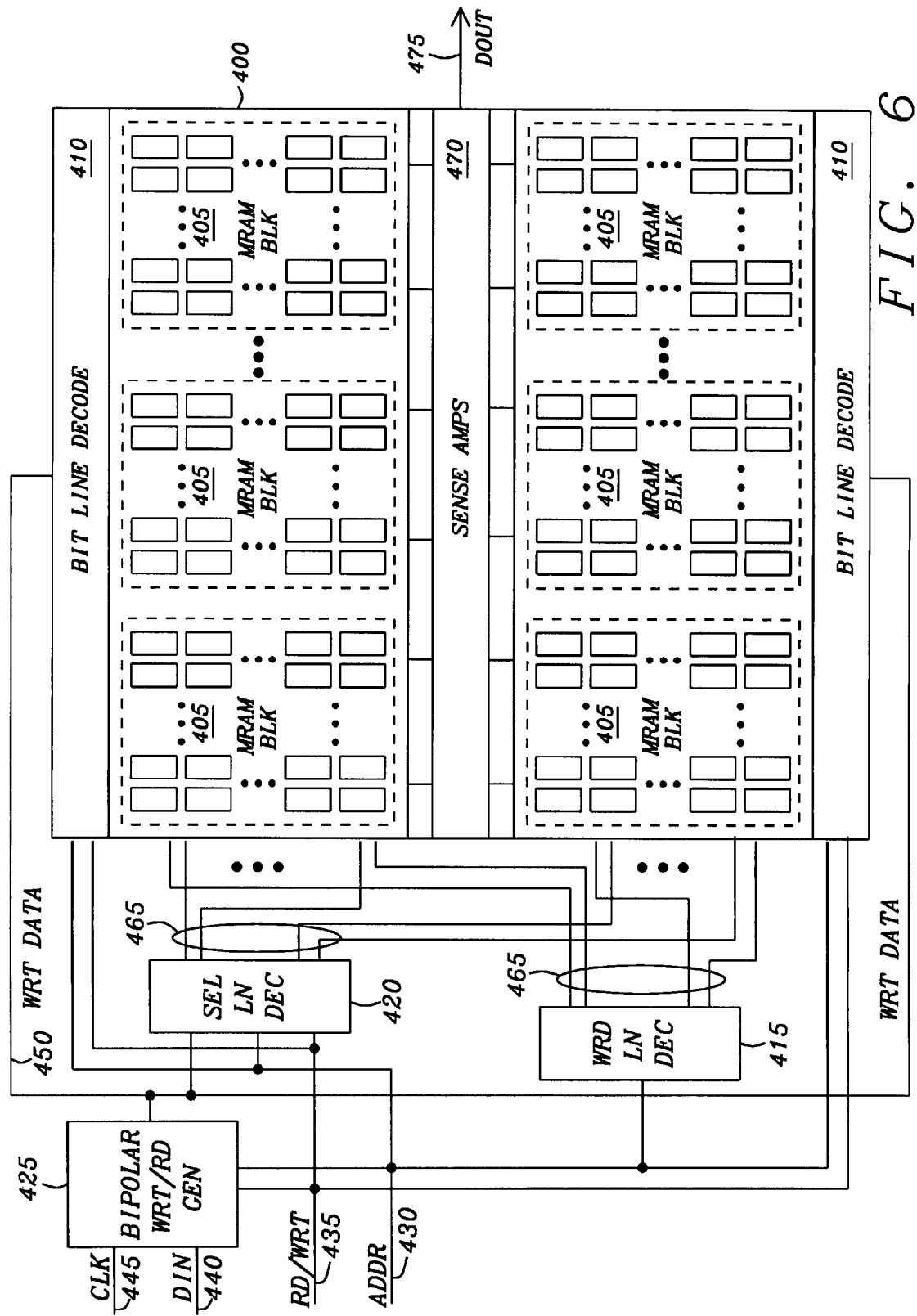
FIG. 6 is block diagram of a spin-torque magnetic tunnel junction memory device of this invention.

Each array of MRAM cells as described are formed into groups of arrays to construct a spin-torque MRAM device as described in FIG. 6. Groups of the MRAM cell arrays 405 are organized into groups of arrays 400. The bit line decode circuit 410 is connected to each of the MRAM cell arrays 405 to provide the data input signal to the appropriate bit lines of the MRAM cell arrays 405 and to provide the column write select signal to activate the gating MOS transistors for a selected column of the MRAM cell arrays 405.

A word line decode circuit 415 is connected to each of the word lines 465 of each of the MRAM cell arrays 405. The word line decode circuit 415 receives the address signal 430 defining which row of which of the MRAM cell arrays 405 is to written to or read from. The source select line decode circuit 420 is connected to source select lines 460 of each row pair of the MRAM cell arrays 405 to provide the source select signal for writing and reading the selected MRAM cells of the MRAM cell arrays 405. The source select line decode circuit 420 receives the address signal 430 and the read/write signal 435 and determines which of the MRAM cells is to read or written.

The bipolar write/read generator 425 receive the data input signal and a clock timing signal 445. With the read/write signal 435 and the address signal 430 provides the necessary biasing and control signals to the bit line decode circuit 410 and the source select line decode circuit 420 for reading data from and writing data to the MRAM cells of the MRAM cell arrays 405. During a read operation, the sense amplifier 470 receives the data sense signals from the selected MRAM cells, amplifies, and conditions the data sense signals to generate the output data signals 475 for transfer external circuitry.

The methods for writing to the spin-torque magnetic random access memory device having arrays of MRAM cells of the first embodiment of this invention, as shown in FIGS. 7a-7d have two steps. The first step writes a first logic level (0) to either those selected MRAM cells that are to have a logic state of the first logic level or to all the MRAM cells. The second step writes a second logic level (1) to only those selected MRAM cells that are to have the logic state of the second logic level. Those MRAM cells that were written to the first logic level in the first step are left unchanged during the second step. The writing of the selected MRAM cells may be for a single selected cell or for multiple cells on a selected row. The entire row may be written in one of the methods for writing.

Refer now FIG. 7a and FIG. 4 for a discussion of writing a single cell within an array of MRAM cells of this invention. The table of FIG. 7a describes the operation of the group of MRAM cells 300 of FIG. 4. In this example, the cell C11 is to be written to the first logic level (0). In the first step, the word line 325a is set to the second logic level (H) to activate the MOS transistors of the MRAM cells 100. The second word line 325b are set to the first logic level to deactivate the MOS transistors of the MRAM cells 100 of the other row of the group 300 of the MRAM cells 100. It is apparent that while we are discussing only the second word line 325b that all other word lines . . . , 325n-1, 325n are deactivated. The column write select signal $y_1$ 320a is set to the second logic level (H) to activate the gating MOS transistor 310a and the column write select signal $y_2$ 320b is set to the first logic level (L) to deactivate the gating MOS transistor 310b. Again it is apparent that the other gating MOS transistors . . . , 310m would also be deactivated. The data input signal 315a is set to the first logic level and the source select line S12 330a is set to the second logic level. The first logic level (0) is written to the MRAM cell C11 and all other MRAM cells 100 remain unchanged. In the second step, the source select line S12 330a is set to the first logic level and the MRAM cell C11 remains unchanged.

In the second example of the table of FIG. 7a, the cell C11 is to be written to the second logic level (1). In the first step the word line 325a is set to the second logic level (H) to activate the MOS transistors of the MRAM cells 100. The second word line 325b are set to the first logic level to deactivate the MOS transistors of the MRAM cells 100 of the other row of the group 300 of the MRAM cells 100. It is apparent that while we are discussing only the second word line 325b that all other word lines . . . , 325n-1, 325n are deactivated. The column write select signal $y_1$ 320a is set to the second logic level (H) to activate the gating MOS transistor 310a and the column write select signal $y_2$ 320b is set to the first logic level (L) to deactivate the gating MOS transistor 310b. Again it is apparent that the other gating MOS transistors . . . , 310m would also be deactivated. The data input signal 315a is set to the first logic level and the source select line S12 330a is set to the second logic level. The MRAM cell C11 remains unchanged as do all other MRAM cells 100 remain unchanged. In the second step, the source select line S12 330a is set to the first logic level and the MRAM cell C11 is now written to the second logic level (1).

Refer now FIG. 7b and FIG. 4 for a discussion of a second approach for writing a single cell within an array of MRAM cells of this invention. The table of FIG. 7b describes the operation of the group of MRAM cells 300 of FIG. 4. In this example, the cell C11 is to be written to the first logic level (0) and the word line word lines 325a and 325b, the column write select signals $y_1$ 320a and $y_2$ 320b, the data input signal 315a, and the source select line S12 330a are set as described in the first method shown in FIG. 7a. In this second method, if the cell C11 is to be written to the second logic level (1), the first step has the data input signal 315a set to the first logic level (L) to write the MRAM cell C11 to the first logic level (0). In the second step, the data input signal 315a is set to the second logic level (H) and the source select line S12 330a is set to the first logic level to write the MRAM cell C11 to the second logic level (1).

Refer now FIG. 7c and FIG. 4 for a discussion of writing a multiple MRAM cells (C11 and C12) within an array of MRAM cells of this invention. The table of FIG. 7c describes the operation of the group of MRAM cells 300 of FIG. 4. In this example, the cells C11 and C12 are to be written. The word lines 325a and 325b, the column write select signals $y_1$ 320a and $y_2$ 320b, the data input signal 315a, and the source select line S12 330a are set as described in the first method shown in FIG. 7a for the first step. The data input signal 315a and 315b are set to their desired logic states (first logic level (0) or the second logic level (1). When the either one or both of the MRAM cells C11 and C12 are to be written to the first logic level (0), those MRAM cells C11 and C12 are written and the others remain unchanged. During the second step, the source select line S12 330a is set to the first logic level to write the MRAM cells C11 and C12 that are to be written to the second logic level (1) and to leave those of the MRAM cells C11 and C12 that were written to the first logic level (0) unchanged.

Refer now FIG. 7d and FIG. 4 for a discussion of a second approach for writing a multiple MRAM cells (C11 and C12) within an array of MRAM cells of this invention. The table of FIG. 7d describes the operation of the group of MRAM cells 300 of FIG. 4. In this example, the cells C11 and C12 are to be written. The word lines 325a and 325b, the column write select signals $y_1$ 320a and $y_2$ 320b, and the source select line S12 330a are set as described in the first method shown in FIG. 7a for the first step. The data input signal 315a and 315b are set to the first logic level (0) to write the first logic level to both the MRAM cells C11 and C12. During the second step, the source select line S12 330a is set to the first logic level and the data input signal 315a and 315b are set to their desired logic levels (first logic level (0) or the second logic level (1) to write the MRAM cells C11 and C12 that are to be written to the second logic level (1) and to leave those of the MRAM cells C11 and C12 that were written to the first logic level (0) remain unchanged.

Figure 8:
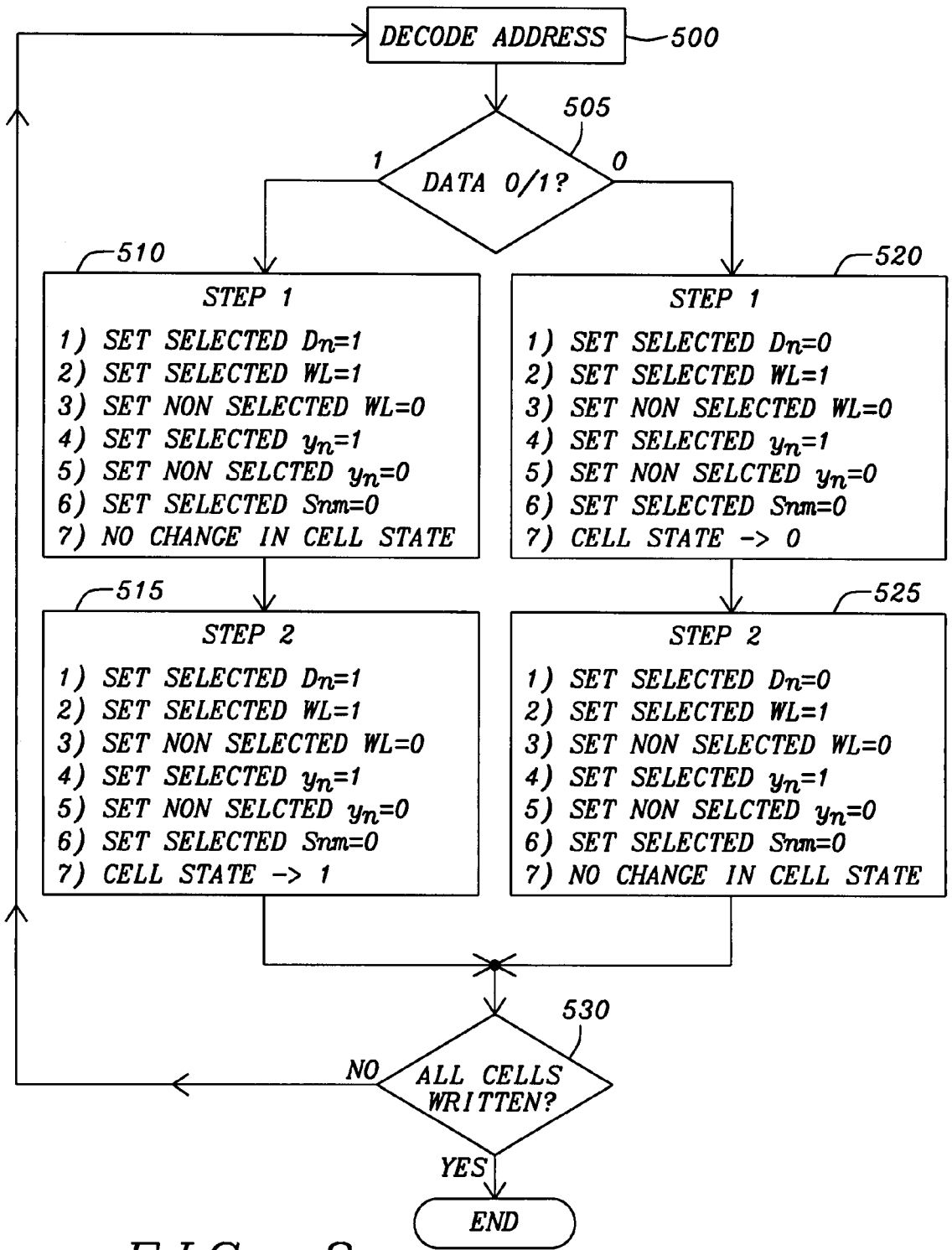
FIG. 8 is process diagram for a first method for writing to the first embodiment of a spin-torque magnetic tunnel junction memory cell array of this invention shown in FIG. 4.

Refer now to FIG. 8 for a discussion of a first method for writing to a single cell of an array of MRAM cells. An address is decoded (Box 500) to select which column and row contains the selected MRAM cell that is to be written to. The input data signal is determined (Box 505). If the data is to be written is the second logic level (1), the first step is performed (Box 510). In the first step, the data input signal set at the second logic level (1) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell inactive. The source select line is set to the second logic level and the selected MRAM cell remains unchanged.

The second step is then performed (Box 515). In the second step, the data input signal set at the second logic level (1) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell inactive. The source select line is set to the first logic level and the selected MRAM cell is written to the second logic state (1).

If the data is to be written is the first logic level (0), the first step is performed (Box 520). In the first step, the data input signal set at the first logic level (0) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell inactive. The source select line is set to the second logic level and the selected MRAM cell is written to the first logic level (0).

The second step is then performed (Box 525). In the second step, the data input signal set at the first logic level (0) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell inactive. The source select line is set to the first logic level and the selected MRAM cell remains unchanged.

The data input signal and the address signal are tested (Box 530) to determine if all selected MRAM cells that are to be written are written. If the selected MRAM cells are not all written, the address is decoded (Box 500) and the process repeated. If the selected MRAM cells are written, the writing process ends.

Figure 9:
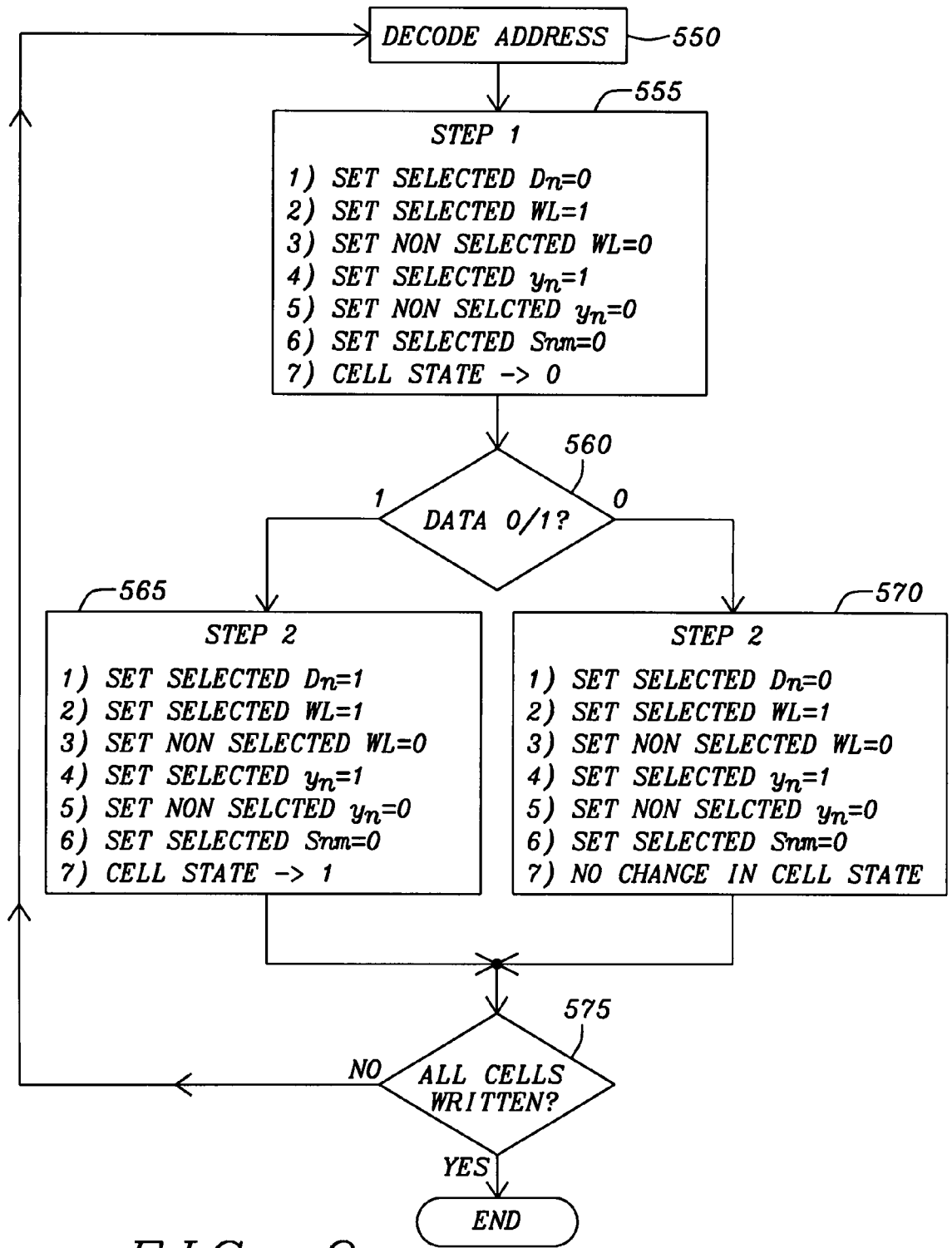
FIG. 9 is process diagram for a second method for writing to the first embodiment of a spin-torque magnetic tunnel junction memory cell array of this invention shown in FIG. 4.

Refer now to FIG. 9 for a discussion of a second method for writing to a single cell of an array of MRAM cells. An address is decoded (Box 550) to select which column and row contains the selected MRAM cell that is to be written to. In the first step (Box 555), the data input signal set at the first logic level (0) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell. The source select line is set to the second logic level and the selected MRAM cell is written to the first logic level (0).

The input data signal is determined (Box 560). If the data is to be written is the second logic level (1), the second step is performed (Box 565). In the second step, the data input signal set at the second logic level (1) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell inactive. The source select line is set to the first logic level and the selected MRAM cell is written to the second logic state (1).

If the data is to be written is the first logic level (0), the second step is then performed (Box 570). In the second step (Box 570), the data input signal set at the first logic level (0) is applied to the drain of the gating MOS transistor on the column containing the selected MRAM cell. The word line connected to the gates of the MOS transistor of the selected MRAM cell is activated and all other word lines are deactivated. The column write select signal activates the gating MOS transistor connected to the column containing the selected MRAM cell. The remaining column write select signals keep the gating MOS transistors connected to the columns that do not contain the selected MRAM cell inactive. The source select line is set to the first logic level and the selected MRAM cell remains unchanged.

The data input signal and the address signal are tested (Box 575) to determine if all selected MRAM cells that are to be written are written. If the selected MRAM cells are not all written, the address is decoded (Box 550) and the process repeated. If the selected MRAM cells are written, the writing process ends.

Figure 10:
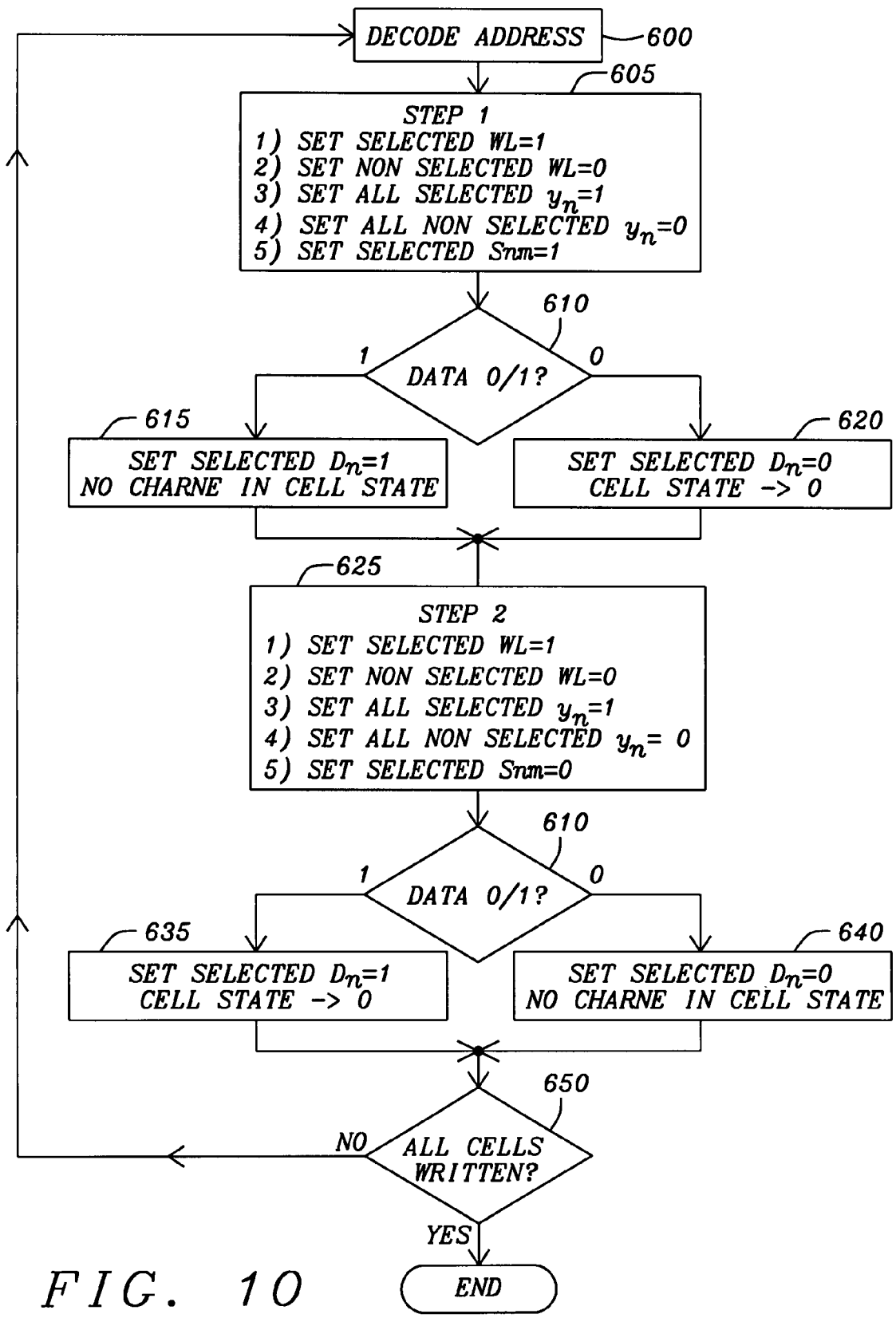
FIG. 10 is process diagram for a third method for writing to the first embodiment of a spin-torque magnetic tunnel junction memory cell array of this invention shown in FIG. 4.

Refer now to FIG. 10 for a discussion of a first method for writing to multiple MRAM cells up to an entire row of MRAM cells of an array of MRAM cells. An address is decoded (Box 600) to select which column and row contains the selected MRAM cells that are to be written to. In the first step (Box 605), the word line (WL) connected to the gates of the MOS transistor of the selected MRAM cell is activated and all other word lines (WL) are deactivated. The column write select signal ($y_n$) activates the gating MOS transistors connected to the columns containing the selected MRAM cells. The remaining non-selected column write select signals ($y_n$) keep the gating MOS transistors connected to the columns that do not contain the selected MRAM cells inactive. The source select line is set to the second logic level. The input data signal ($D_n$) is determined (Box 610). If the data is to be written is the second logic level (1), data input signal set at the second logic level (1) is applied to the drains of the gating MOS transistors on the columns containing the selected MRAM cells and those of the selected MRAM cells that are to be written to the second logic level (1) are not changed. If the data to be written is the first logic level (0), data input signal set at the first logic level (0) is applied to the drain of the gating MOS transistors on the columns containing the selected MRAM cells and those of the selected MRAM cells that are to be written to the first logic level (0) have their logic state change to the first logic level (0).

The second step is then performed (Box 625). In the second step (Box 625), the word line (WL) connected to the gates of the MOS transistors of the selected MRAM cells are activated and all other word lines (WL) are deactivated. The column write select signal ($y_n$) activates the gating MOS transistors connected to the column containing the selected MRAM cells. The remaining column write select signals ($y_n$) keep the gating MOS transistors connected to the columns that do not contain the selected MRAM cells inactive. The source select line is set to the first logic level. The input data signal ($D_n$) is determined (Box 630). If the data is to be written is the second logic level (1), data input signal set at the second logic level (1) is applied to the drains of the gating MOS transistors on the columns containing the selected MRAM cells and those of the selected MRAM cells that are to be written to the second logic level (1) have their logic state change to the second logic level (1). If the data to be written is the first logic level (0), data input signal is set at the first logic level (0) is applied to the drains of the gating MOS transistors on the columns containing the selected MRAM cells and those of the selected MRAM cells that are to be written to the first logic level (0) remain unchanged.

The data input signal and the address signal are tested (Box 650) to determine if all selected MRAM cells that are to be written are written. If the selected MRAM cells are not all written, the address is decoded (Box 600) and the process repeated. If the selected MRAM cells are written, the writing process ends.

Figure 11:
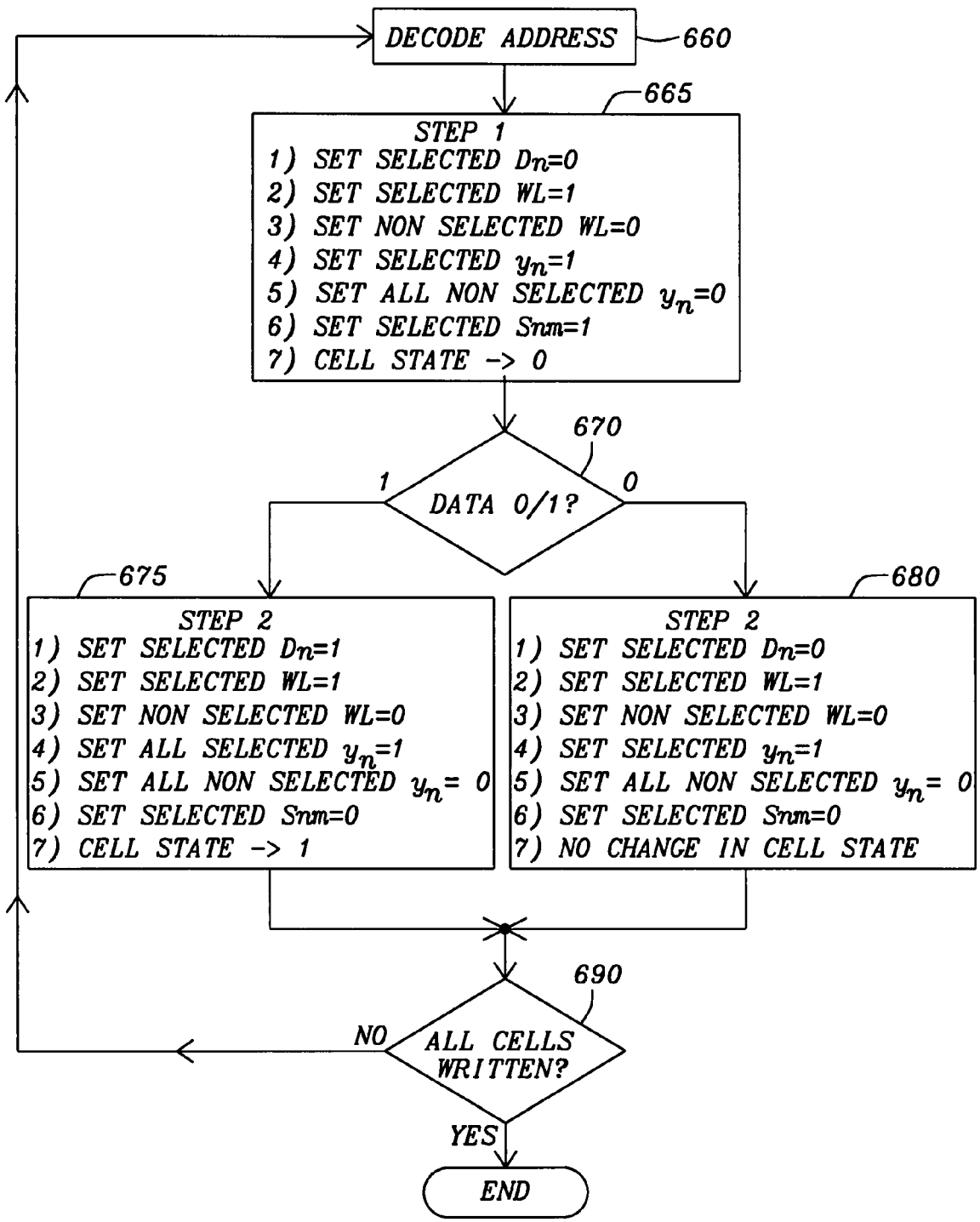
FIG. 11 is process diagram for a fourth method for writing to the first embodiment of a spin-torque magnetic tunnel junction memory cell array of this invention shown in FIG. 4.

Refer now to FIG. 11 for a discussion of a second method for writing to a multiple cells up to an entire row of an array of MRAM cells. An address is decoded (Box 660) to select which column and row contains the selected MRAM cell that is to be written to. In the first step (Box 665), data input signal ($D_n$) set at the first logic level (0) is applied to the drains of the gating MOS transistors on the columns containing the selected MRAM cells. The word line (WL) connected to the gates of the MOS transistors of the selected MRAM cells is activated and all other word lines are deactivated. The column write select signal ($y_n$) activates the gating MOS transistors connected to the columns containing the selected MRAM cells. The remaining column write select signals ($y_n$) keep the gating MOS transistors connected to the columns that do not contain the selected MRAM cell inactive. The source select line ($y_n$) is set to the second logic level and the data for all the selected MRAM cells have their logic state change to the first logic level (0).

The input data signal ($D_n$) is determined (Box 670). For the data to be written that is the second logic level (1), the second step is performed (Box 675). In the second step (Box 675), the data input signal set at the second logic level (1) is applied to the drains of the gating MOS transistor on the columns containing the selected MRAM cells that are to be to the second logic level (1). The word line (WL) connected to the gates of the MOS transistors of the selected MRAM cells is activated and all other word lines (WL) are deactivated. The column write select signal ($S_{nm}$) activates the gating MOS transistors connected to the columns containing the selected MRAM cells. The remaining column write select signals ($S_{nm}$) keep the gating MOS transistors connected to the columns that do not contain the selected MRAM cell inactive. The source select line ($y_n$) is set to the first logic level (0) and the selected MRAM cell is written to the second logic state (1).

For the data that is to be written is the first logic level (0), the second step is then performed (Box 680). In the second step (Box 680), the data input signal ($D_n$) set at the first logic level (0) is applied to the drains of the gating MOS transistors on the columns containing the selected MRAM cells that are to be written to the first logic level (0). The word line (WL) connected to the gates of the MOS transistors of the selected MRAM cells is activated and all other word lines (WL) are deactivated. The column write select signal ($y_n$) activates the gating MOS transistors connected to the columns containing the selected MRAM cells. The remaining column write select signals ($y_n$) keep the gating MOS transistors connected to the columns that do not contain the selected MRAM cells inactive. The source select line ($S_{nm}$) is set to the first logic level and the selected MRAM cell remains unchanged.

The data input signal ($D_n$) and the address signal are tested (Box 690) to determine if all selected MRAM cells that are to be written are written. If the selected MRAM cells are not all written, the address is decoded (Box 660) and the process repeated. If the selected MRAM cells are written, the writing process ends.

Figure 12:
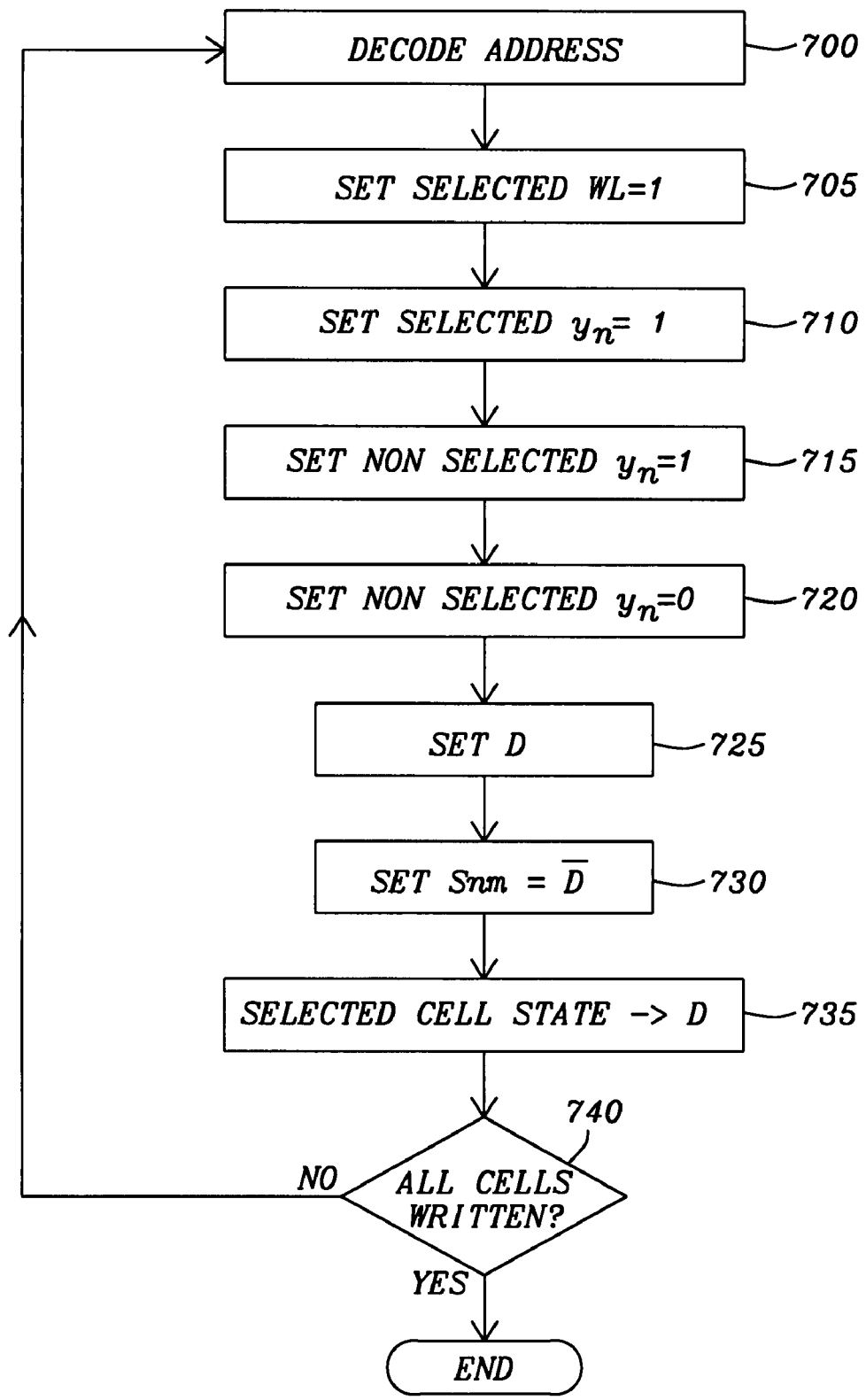
FIG. 12 is process diagram for a method for writing to the second embodiment of a spin-torque magnetic tunnel junction memory cell array of this invention shown in FIG. 5.

The method of writing to a selected MRAM cell of the second embodiment of the spin-torque MRAM array of this invention is shown in FIG. 12. As shown in FIG. 5, the bit lines that are connected to each of the MRAM cells for each column of the MRAM cells are commonly connected to receive one data signal bit. Similarly, the source select lines that are connected to each MRAM cell of a pair of rows of MRAM cells are commonly connected. A receive address is decoded (Box 700). The word line connected to the gate of the MOS transistor of the selected MRAM cell is activated (Box 705) and all other word lines are deactivated (Box 710). The column write select signal activates (Box 715) the gating MOS transistor connected to the column containing the selected MRAM cell. The remaining column write select signals keep the gating MOS transistors connected to the columns that do not contain the selected MRAM cell are inactive (Box 720). The data input signal D is applied (Box 725) to all the drains of the gating MOS transistors on the all the columns of the spin-torque MRAM array. The inverse data signal $\overline{D}$ is applied (Box 730) to the source select line of the row containing the selected MRAM cell. The selected MRAM cell is written to the logic state of the data input signal D (Box 735).

The data input signal and the address signal are tested (Box 740) to determine if all selected MRAM cells that are to be written are written. If the selected MRAM cells are not all written, the address is decoded (Box 700) and the process repeated. If the selected MRAM cells are written, the writing process ends.

The spin-torque MRAM array of this invention provides a more area efficient, smaller spin-torque MRAM array. The two step writing method (writing the first logic level (0) in the first step and writing the second logic level in the second step (1)) allows for operation with the source select lines that are orthogonal to the bit lines of the array. The two step writing method adds a very small overhead in the writing time while the area of the spin-torque MRAM array is minimized.

While this invention has been particularly shown and described with reference to the preferred embodiments thereof, it will be understood by those skilled in the art that various changes in form and details may be made without departing from the spirit and scope of the invention.

The invention claimed is:

1. A spin-torque MRAM cell array comprising:
   a plurality of spin-torque MRAM cells arranged in rows and columns, each spin-torque MRAM cell comprising:
   a magnetic tunnel junction element, and
   a select switching device having a drain terminal connected to a first terminal of said magnetic tunnel junction element;
   a plurality of bit lines, each bit line associated with one column of the columns of the plurality of spin-torque MRAM cells and connected to a second terminal of said magnetic tunnel junction element;

a plurality of word lines, each word line associated with one row of the plurality of spin-torque MRAM cells and connected to a gate terminal of said select switching device of each spin-torque MRAM cell on each row to control activation and deactivation of said select switching device;

a plurality of source select lines, each source select line placed orthogonally to said plurality of bit lines and associated with one pair of rows of said plurality of spin-torque MRAM cells and connected to a source terminal of said select switching device of each of said spin-torque MRAM cells on the associated pair of rows of said plurality of spin-torque MRAM cells wherein each source select line transmits a source line input signal applied to the source of the select switching device of at least one of the plurality of spin-torque MRAM cells on a selected word line and is set at a first logic level during a first writing step of selected spin-torque MRAM cells on the selected word line and subsequently toggled to a second logic level during a second writing step, wherein the first logic level is different from the second logic level; and a plurality of column write select devices, each column write select device associated with one column of said plurality of spin-torque MRAM cells and having a source terminal connected to the associated bit line of said plurality of bit lines, a drain terminal connected to receive a data input signal and a gate terminal connected to receive one of a plurality of column write select signals.

2. The spin-torque MRAM cell array of claim 1 wherein said data input signal comprises separate bits to be transferred individually to each of said drains of said plurality of column write select devices.

3. The spin-torque MRAM cell array of claim 1 wherein said data input signal is a single bit and all the drain terminals of said plurality of column write select devices are commonly connected.

4. The spin-torque MRAM cell array of claim 3 wherein all of said plurality of source select lines are commonly connected and the source line input signal is an inverse data input signal.

5. The spin-torque MRAM cell array of claim 1 further comprising an apparatus for writing a selected spin-torque MRAM cell comprising:

means for activating the word line associated with said selected spin-torque MRAM cell;

means for activating the column write select signal connected to the column write select device connected to the column associated with said selected spin-torque MRAM cell;

means for applying data input signal to the drain of said column write select device connected to the one column associated with said selected spin-torque MRAM cell; and means for applying the source line input signal to the source select line of the pair of rows associated with said selected spin-torque MRAM cell and sets the source line input signal to the first logic level during a first writing step of selected spin-torque MRAM cells on the selected word line and toggles to the second logic level during a second writing step.

6. The spin-torque MRAM cell array of claim 5 wherein when the input data signal is equal to said first logic level during said first writing step a program state of said selected spin-torque MRAM cell does not change and when the input data signal is the first logic level during said first writing step, the program state of said selected spin-torque MRAM cell changes.

7. The spin-torque MRAM cell array of claim 6 wherein when the input data signal is equal to said second logic level during said second writing step the program state of said selected spin-torque MRAM cell does not change and when the input data signal is the inverse of the first logic level during said second writing step, the program state of said selected spin-torque MRAM cell changes.

8. The spin-torque MRAM cell array of claim 1 further comprising an apparatus for writing a selected spin-torque MRAM cell comprising:

means for activating the word line associated with said selected spin-torque MRAM cell;

means for activating the column write select signal connected to the column write select device connected to the column associated with said selected spin-torque MRAM cell;

means for applying the data input signal to the drain of said column write select device connected to the one column associated with said selected spin-torque MRAM cell; and means for applying an inverse data signal to the source select line of the pair of rows associated with said selected spin-torque MRAM cell to write the input data signal to selected spin-torque MRAM cell.

9. The spin-torque MRAM cell array of claim 1 further comprising an apparatus for writing the input data signal to a plurality of selected spin-torque MRAM cells comprising:

means for activating the word line associated with said plurality of selected spin-torque MRAM cell;

means for activating the column write select signals connected to the column write select devices connected to the columns associated with said plurality of selected spin-torque MRAM cell;

means for applying data input signals representative of input data to be written said plurality of selected spin-torque MRAM cells to the drains of said column write select devices connected to the columns associated with each of said plurality of selected spin-torque MRAM cell; and means for applying a source line input signal to the source select line of the pair of rows associated with said plurality selected spin-torque MRAM cells and sets the source line input signal to the first logic level during a first writing step of selected spin-torque MRAM cells on the selected word line to write said second logic level to those selected spin-torque MRAM cell that are to have the second logic level written to them and to leave unchanged those of the plurality of selected spin-torque MRAM cells that are to have said second logic level written to them.

10. The spin-torque MRAM cell array of claim 9 wherein said means for applying the source line input signal to said plurality of selected spin-torque MRAM cells toggles to the second logic level during a second writing step of selected spin-torque MRAM cells on the selected word line for applying said second logic level to the source select line of the pair of rows associated with said plurality of selected spin-torque MRAM cells such that said first logic level is written to those of the plurality of selected spin-torque MRAM cells that are to have said first logic level written to them and leave unchanged those of the plurality of selected spin-torque MRAM cells that have had the second logic level written to them.

11. The spin-torque MRAM cell array of claim 1 wherein an apparatus for writing input data to a plurality of selected spin-torque MRAM cells have comprising:
  means for performing a first writing step, comprising:
    means for activating the word line associated with said plurality of selected spin-torque MRAM cells,
    means for activating the column write select signals connected to the column write select devices connected to the columns associated with said plurality of selected spin-torque MRAM cells,
    means for applying said input data signals to be written said plurality of selected spin-torque MRAM cells to the drains of said column write select devices connected to the columns associated with each of said plurality of selected spin-torque MRAM cells, and
    means for applying the source line select signal as the first logic level to the source select line of the pair of rows associated with said plurality selected spin-torque MRAM cell to write said second logic level to all selected spin-torque MRAM cells having the second logic level to be written to the those of the selected spin-torque MRAM cells and leaving unchanged those of the plurality of selected spin-torque MRAM cells that have had the first logic level written to them; and
  means for performing a second writing step comprising:
    means for toggling said select line input signal to the second logic level to the source select line of the pair of rows associated with said plurality of selected spin-torque MRAM cells such that said first logic level is written to those of the plurality of selected spin-torque MRAM cells that are to have said first logic level written to them and leave unchanged those of the plurality of selected spin-torque MRAM cells that are to have the second logic level written to them.

12. The spin-torque MRAM cell array of claim 4 wherein an apparatus for writing input data to a selected spin-torque MRAM cell comprising:
  means for activating the word line associated with said selected spin-torque MRAM cell;
  means for activating the column write select signal connected to the column write select device connected to the column associated with said selected spin-torque MRAM cell;
  means for applying data input signals representative of input data to be written said selected spin-torque MRAM cell to the drain of said column write select device connected to the column associated with said selected spin-torque MRAM cell; and
  means for applying said inverse data input signals to the source select line of the pair of rows associated with said plurality selected spin-torque MRAM cell to write said input data to said selected spin-torque MRAM cell.

13. A spin-torque magnetic random access memory device comprising
  a plurality of spin-torque MRAM cell arrays arranged in a plurality of groups, each spin-torque MRAM array comprising:
    a plurality of spin-torque MRAM cells arranged in rows and columns, each spin-torque MRAM cell comprising:
      a magnetic tunnel junction element, and
      a select switching device having a drain terminal connected to a first terminal of said magnetic tunnel junction element;
    a plurality of bit lines, each bit line associated with one column of the columns of the plurality of spin-torque MRAM cells and connected to a second terminal of said magnetic tunnel junction element,
    a plurality of word lines, each word line associated with one row of the plurality of spin-torque MRAM cells and connected to a gate terminal of said select switching device of each spin-torque MRAM cell on each row to control activation and deactivation of said select switching device,
    a plurality of source select lines, each source select line placed orthogonally to said plurality of bit lines and associated with one pair of rows of said plurality of spin-torque MRAM cells and connected to a source terminal of said select switching device of each of said spin-torque MRAM cells on the associated pair of rows of said plurality of spin-torque MRAM cells wherein each source select line transmits a source line input signal applied to the source of the select switching device of at least one of the plurality of spin-torque MRAM cells on a selected word line and is set at a first logic level during a first writing step of selected spin-torque MRAM cells on the selected word line and subsequently toggled to a second logic level during a second writing step, wherein the first logic level is different from the second logic level, and
    a plurality of column write select devices, each column write select device associated with one column of said plurality of spin-torque MRAM cells and having a source terminal connected to the associated bit line of said plurality of bit lines, a drain terminal connected to receive a data input signal and a gate terminal connected to receive one of a plurality of column write select signals;
  a bit line decode circuit to receive an address, input data, and a read/write select signal, decode said address, input data, and read/write select signal, and in communication with said plurality of bit lines, said drain terminals, and gate terminals of each of said plurality of write select devices to select which of said bit lines are activated for reading one of said spin-torque MRAM cells on each selected column and activate those of said column write select devices of a selected column to transfer said input data signal derived from said input data to one selected spin-torque MRAM cell on at least one said selected column;
  a word line decode circuit to receive said address and in communication with each of said plurality of word lines, and decoding said address to activate one of said word lines on one row of said array of spin-torque MRAM cells; and
  a select line decode circuit to receive said address and said read/write select signal to decode said address and in communication with each of said plurality of source select lines to select one of said source select lines from decoding said address to provide the first logic level and the second logic level for reading and said source line input signal for writing said selected spin-torque MRAM cells.

14. The spin-torque magnetic random access memory device of claim 13 further comprising a sense amplifier connected to each of the plurality of bit lines to receive a data read signal from selected spin-torque MRAM cells, amplify and condition said data read signal to generate output data read from said selected spin-torque MRAM cells.

15. The spin-torque magnetic random access memory device of claim 13 wherein said data input signal comprises separate bits to be transferred individually to each of said drains of said plurality of column write select devices.

16. The spin-torque magnetic random access memory device of claim 13 wherein said data input signal is a single bit and all the drain terminals of said plurality of column write select devices are commonly connected.

17. The spin-torque magnetic random access memory device of claim 16 wherein all of said plurality of source select lines are commonly connected to receive the source line input signals that is an inverse data input signal.

18. The spin-torque magnetic random access memory device of claim 13 wherein a selected spin-torque MRAM cell is written by:
said word line decode circuit activating the word line associated with said selected spin-torque MRAM cell;
said bit line decode circuit activating the column write select signal connected to the column write select device connected to the column associated with said selected spin-torque MRAM cell;
said bit line decode circuit applying said data input signal to the drain of said column write select device connected to the one column associated with said selected spin-torque MRAM cell; and
said select line decode circuit applying said source line input signal to the source select line of the pair of rows associated with said selected spin-torque MRAM cell that is set the first logic level during a first writing step of selected spin-torque MRAM cells on the selected word line and to toggle to the second logic level during a second writing step.

19. The spin-torque magnetic random access memory device of claim 18 wherein when the input data signal is equal to said first logic level during said first writing step, a program state of said selected spin-torque MRAM cell does not change and when the input data signal is the second logic level during said first writing step, the program state of said selected spin-torque MRAM cell changes.

20. The spin-torque magnetic random access memory device of claim 19 wherein when the input data signal is equal to said second logic level during said second writing step the program state of said selected spin-torque MRAM cell does not change and when the input data signal is the inverse of the first logic level during said second writing step, the program state of said selected spin-torque MRAM cell changes.

21. The spin-torque magnetic random access memory device of claim 13 wherein a selected spin-torque MRAM cell is written to by:
said word line decode circuit activating the word line associated with said selected spin-torque MRAM cell;
said bit line decode circuit activating the column write select signal connected to the column write select device connected to the column associated with said selected spin-torque MRAM cell;
said bit line decode circuit applying data input signal as said first logic level to the drain of said column write select device connected to the one column associated with said selected spin-torque MRAM cell; and
said select line decode circuit applying an inverse data input signal to the source select line of the pair of rows associated with said selected spin-torque MRAM cell to write said first logic level to selected spin-torque MRAM cell.

22. The spin-torque magnetic random access memory device of claim 13 wherein a plurality of selected spin-torque MRAM cells have the data input signal written to them by:
said word line decode circuit activating the word line associated with said plurality of selected spin-torque MRAM cell;
said bit line decode circuit activating the column write select signals connected to the column write select devices connected to the columns associated with said plurality of selected spin-torque MRAM cell;
said bit line decode circuit applying data input signals representative of input data to be written said plurality of selected spin-torque MRAM cells to the drains of said column write select devices connected to the columns associated with each of said plurality of selected spin-torque MRAM cell; and
said select line decode circuit applying a source line input signal to the source select line of the pair of rows associated with said plurality selected spin-torque MRAM cells and sets the first logic level during a first writing step of selected spin-torque MRAM cells on the selected word line to write said second logic level to those selected spin-torque MRAM cell that are to have the second logic level written to them and to leave unchanged those of the plurality of selected spin-torque MRAM cells that are to have said first logic level written to them.

23. The spin-torque magnetic random access memory device of claim 22 wherein during said writing said input data to said plurality of selected spin-torque MRAM cells said select line decode circuit toggles to the second logic level during a second writing step of selected spin-torque MRAM cells on the selected word line for applying said second logic level to the source select line of the pair of rows associated with said plurality of selected spin-torque MRAM cells such that said first logic level is written to those of the plurality of selected spin-torque MRAM cells that are to have said first logic level written to them and leave unchanged those of the plurality of selected spin-torque MRAM cells that have had the second logic level written to them.

24. The spin-torque magnetic random access memory device of claim 13 wherein a plurality of selected spin-torque MRAM cells have data written in two writing steps, wherein:
during a first of the two writing steps:
said word line decode circuit activates the word line associated with said plurality of selected spin-torque MRAM cells,
said bit line decode circuit activates the column write select signals connected to the column write select devices connected to the columns associated with said plurality of selected spin-torque MRAM cells,
said bit line decode circuit applies the data input signal to be written said plurality of selected spin-torque MRAM cells to the drains of said column write select devices connected to the columns associated with each of said plurality of selected spin-torque MRAM cells, and
said select line decode circuit applying the second logic level to the source select line of the pair of rows associated with said plurality selected spin-torque MRAM cell to write said first logic level to all selected spin-torque MRAM cells having the first logic level to be written to the those of the selected spin-torque MRAM cells and leaving unchanged those of the plurality of selected spin-torque MRAM cells that have had the second logic level written to them; and
during a second of the two writing steps:
said select line decode circuit applies said second logic level to the source select line of the pair of rows associated with said plurality of selected spin-torque MRAM cells such that said first logic level is written to those of the plurality of selected spin-torque MRAM cells that are to have said first logic level written to them and leave unchanged those of the plurality of selected spin-torque MRAM cells that have had the second logic level written to them.

25. The spin-torque magnetic random access memory device of claim 17 wherein a selected spin-torque MRAM cell has the input data signal written to it by:
- said word line decode circuit activating the word line associated with said selected spin-torque MRAM cell;
- said bit line decode circuit activating the column write select signal connected to the column write select device connected to the column associated with said selected spin-torque MRAM cell;
- said bit line decode circuit applying the data input signal to be written said selected spin-torque MRAM cell to the drain of said column write select device connected to the column associated with said selected spin-torque MRAM cell; and
- said select line decode circuit applying said inverse data input signals to the source select line of the pair of rows associated with said plurality selected spin-torque MRAM cell to write said input data to said selected spin-torque MRAM cell.

26. A method for programming a spin-torque MRAM cell array comprising the steps of:
- providing a plurality of spin-torque MRAM cells arranged in rows and columns, each spin-torque MRAM cell comprising:
  - a magnetic tunnel junction element, and
  - a select switching device having a drain terminal connected to a first terminal of said magnetic tunnel junction element;
- providing a plurality of bit lines by the step of:
  - associating each bit line with one column of the columns of the plurality of spin-torque MRAM cells and connecting each bit line to a second terminal of said magnetic tunnel junction element;
- providing a plurality of word lines by the step of:
  - associating each word line with one row of the plurality of spin-torque MRAM cells and connecting each word line to a gate terminal of said select switching device of each spin-torque MRAM cell on each row to control activation and deactivation of said select switching device;
- providing a plurality of source select lines by the step of;
  - placing each source select line orthogonally to said plurality of bit lines, and
  - associating each source select line with one pair of rows of said plurality of spin-torque MRAM cells and connecting each source select line to a source terminal of said select switching device of each of said spin-torque MRAM cells on the associated pair of rows of said plurality of spin-torque MRAM cells, and
  - transmitting on each source select line a source line input signal that is applied to the source of the select switching device of at least one of the plurality of spin-torque MRAM cells on a selected word line,
  - setting the source line input signal to a first logic level during a first writing step of selected spin-torque MRAM cells on the selected word line,
  - subsequently toggling the source line input signal to a second logic level during a second writing step, wherein the first logic level is different from the second logic level; and
- providing a plurality of column write select devices by the step of:
  - associating each column write select device associated with one column of said plurality of spin-torque MRAM cells and having a source terminal connected to each of said plurality of bit lines, a drain terminal connected to receive a data input signal and a gate terminal connected to receive one of a plurality column write select signals.

27. The method for programming a spin-torque MRAM cell array of claim 26 wherein said data input signal comprises separate bits to be transferred individually to each of said drains of said plurality of column write select devices.

28. The method for programming a spin-torque MRAM cell array of claim 26 wherein said data input signal is a single bit and all the drain terminals of said plurality of column write select devices are commonly connected.

29. The method for programming a spin-torque MRAM cell array of claim 28 wherein all of said plurality of source select lines are commonly connected to receive an inverse data input signal.

30. The method for programming a spin-torque MRAM cell array of claim 26 further comprising the step of:
- writing a selected spin-torque MRAM cell by the steps of:
  - activating the word line associated with said selected spin-torque MRAM cell;
  - activating the column write select signal connected to the column write select device connected to the column associated with said selected spin-torque MRAM cell;
  - applying said data input signal to the drain of said column write select device connected to the one column associated with said selected spin-torque MRAM cell; and
  - applying said source line input signal to the source select line of the pair of rows associated with said selected spin-torque MRAM cell such that when the input data signal is equal to said second logic level during said first writing step a program state of said selected spin-torque MRAM cell changes to the second logic level and when the input data signal is the first logic level during said first writing step, the program state of said selected spin-torque MRAM cell does not change.

31. The method for programming a spin-torque MRAM cell array of claim 30 the step of applying said source line input signal to the source select line of the pair of rows associated with said selected spin-torque MRAM cell comprises the step of toggling the source line input signal from the first logic level to the second logic level in a second writing step such that when the input data signal is equal to said second logic level during said second writing step the program state of said selected spin-torque MRAM cell does not change and when the input data signal is the first logic level, the program state of said selected spin-torque MRAM cell changes to the first logic level.

32. The method for programming a spin-torque MRAM cell array of claim 26 further comprising the step of:
- writing data to said selected spin-torque MRAM cell during a first writing step by:
  - activating the word line associated with said plurality of selected spin-torque MRAM cell;
  - activating the column write select signals connected to the column write select devices connected to the columns associated with said plurality of selected spin-torque MRAM cell;
  - applying data input signal to the drains of said column write select devices connected to the columns associated with each of said plurality of selected spin-torque MRAM cell; and applying a first logic level to the source select line of the pair of rows associated with said selected spin-torque MRAM cell to write said second logic level to the selected spin-torque MRAM cell when the input data signal is the second logic level and to leave unchanged selected spin-torque MRAM cell the input data signal is said first logic level.

33. The method for programming a spin-torque MRAM cell array of claim 32 further comprising the step of:
writing said input data to said plurality of selected spin-torque MRAM cell, a second writing step is accomplished by:
applying said second logic to the source select line of the pair of rows associated with said selected spin-torque MRAM cell such that said first logic level is written to the selected spin-torque MRAM cell when the input data signal is said first logic level and leave unchanged the selected spin-torque MRAM cell when the input data signal is the second logic level.

34. The method for programming a spin-torque MRAM cell array of claim 26 further comprising the step of:
writing the input data signal to said selected spin-torque MRAM cells of the plurality of spin-torque MRAM cells by the steps of:
performing a first writing step by:
activating the word line associated with said plurality of selected spin-torque MRAM cells,
activating the column write select signals connected to the column write select devices connected to the columns associated with said plurality of selected spin-torque MRAM cells,
applying input data signals to the drains of said column write select devices connected to the columns associated with each of said selected spin-torque MRAM cells, and
applying a first logic level to the source select line of the pair of rows associated with said selected spin-torque MRAM cells to write said second logic level to all selected spin-torque MRAM cells for those of the selected spin-torque MRAM cells having the input data signal applied as the second logic level and leaving those selected spin-torque MRAM cells having the input data applied as the first logic level unchanged; and
performing a second writing step is accomplished by:
applying said second logic to the source select line of the pair of rows associated with said selected spin-torque MRAM cells such that said first logic level is written to those of the plurality of selected spin-torque MRAM cells that are to have said first logic level written to them and leave unchanged those of the plurality of selected spin-torque MRAM cells that have had the second logic level written to them.

35. The method for programming a spin-torque MRAM cell array of claim 29 further comprising the step of:
writing data to said selected spin-torque MRAM cell by the steps of:
activating the word line associated with said selected spin-torque MRAM cell;
activating the column write select signal connected to the column write select device connected to the column associated with said selected spin-torque MRAM cell;
applying said input data signal to the drains of said column write select devices connected to the columns associated with said selected spin-torque MRAM cell; and
applying said inverse data input signal to the source select line of the pair of rows associated with said plurality selected spin-torque MRAM cell to write said input data signal to said selected spin-torque MRAM cell.

* * * * *